United States Patent [19]

Ting

[11] Patent Number: 5,640,327

[45] Date of Patent: Jun. 17, 1997

[54] APPARATUS AND METHOD FOR PARTITIONING RESOURCES FOR INTERCONNECTIONS

[75] Inventor: Benjamin S. Ting, Saratoga, Calif.

[73] Assignee: BTR, Inc., Reno, Nev.

[21] Appl. No.: 599,122

[22] Filed: Feb. 9, 1996

Related U.S. Application Data

[63] Continuation of Ser. No. 186,770, Jan. 25, 1994, abandoned.

[51] Int. Cl.⁶ .................................................. G06F 17/50
[52] U.S. Cl. .......................... 364/488; 364/489; 364/490
[58] Field of Search ................................... 364/488, 489, 364/490, 491; 326/37, 39, 41, 47, 101; 340/825.83

[56] References Cited

U.S. PATENT DOCUMENTS

| | | | |
|---|---|---|---|
| 3,617,714 | 11/1971 | Kernighan et al. | 364/488 |
| 4,554,625 | 11/1985 | Otten | 364/148 |
| 4,577,276 | 3/1986 | Dunlop et al. | 364/491 |
| 4,593,363 | 6/1986 | Burstein et al. | 364/491 |
| 4,612,618 | 9/1986 | Pryor et al. | 364/490 |
| 4,688,072 | 8/1987 | Heath et al. | 357/45 |

(List continued on next page.)

OTHER PUBLICATIONS

Sun et al., "An Area Minimizer for Floorplans W/ L–shaped Regions," 1992 Int'l Conference on Computer Design, pp. 383–386.

Chrzanowska–Jeske, et al.; "Partitioning Approach to Find and Exact Solution to the Fitting Problem in an Application–Specific EPLD Device"; pp. 39–44, 1993.

(List continued on next page.)

*Primary Examiner*—Kevin J. Teska
*Assistant Examiner*—Leigh Marie Garbowski
*Attorney, Agent, or Firm*—Blakely, Sokoloff, Taylor & Zafman

[57] ABSTRACT

An apparatus and method for determining how to interconnect a plurality of components of a system, given a limited number of interconnect resources available to a device. First, it is determined whether the system meets the capacity constraints of the device. If the requirements exceed the capacity, a larger device is necessary. Otherwise, a topmost interconnection level is established. This topmost level is partitioned into four different partitions. The components are assigned and optimized to these four partitions. Next, a lower level of interconnection is established for one or more of these four partitions. Each of these lower levels are, in turn, partitioned into four different partitions. Components are then assigned and optimized to these partitions. This process is repeated for even lower levels until routing of the interconnections for the system is achieved. Thereupon, the components are physically interconnected from the lower levels to the topmost level according to the routing pattern that was determined in the establishing, partitioning, and said optimizing steps.

23 Claims, 18 Drawing Sheets

U.S. PATENT DOCUMENTS

| | | | |
|---|---|---|---|
| 4,713,773 | 12/1987 | Cooper et al. | 364/491 |
| 4,754,408 | 6/1988 | Carpenter et al. | 364/491 |
| 4,777,606 | 10/1988 | Fournier | 364/491 |
| 4,908,772 | 3/1990 | Chi | 364/491 |
| 4,918,614 | 4/1990 | Modarres et al. | 364/490 |
| 5,046,017 | 9/1991 | Yuyama et al. | 364/491 |
| 5,128,871 | 7/1992 | Schmitz | 364/490 |
| 5,218,551 | 6/1993 | Agrawal et al. | 364/491 |
| 5,224,056 | 6/1993 | Chene et al. | 364/490 |
| 5,224,057 | 6/1993 | Igarashi et al. | 364/490 |
| 5,251,147 | 10/1993 | Finnerty | 364/490 |
| 5,375,069 | 12/1994 | Satoh et al. | 364/490 |

OTHER PUBLICATIONS

Braun et al., "Techniques for Multilayer Channel Routing," IEEE Trans. on CAD, vol. 7, No. 6, Jun. 1988, pp. 698–712.

Burstein et al., "Timing Influenced Layout Design," 1985 22nd Design Automation Conf., Paper 9.2, pp. 124–130.

Greenberg et al., "Mulch: A Muli–layer Channel Router Using One, Two, and Three Layer Partitions," 1988 Int'l CAD Conf., pp. 88–91.

Hamada et al., "An Efficient Multi–Level Placement Technique Using Hierarchical Partitioning," 1991 IEEE Int'l Symp. on Ckts & Sys., pp. 2044–2047.

Roy et al., "A Timing Driven N–Way Chip & Multi–chip Partitioner," IEEE/ACM Int'l Conf on CAD–93, pp. 240–247.

Ho et al., "Layer Assignment for Multichip Modules," IEEE Trans. on CAD, vol. 9, No. 12, Dec. 1990, pp. 1272–1277.

Lim et al., "Performance Driven Placement w/Global Routing for Macro Cells," 1992 Great Lakes VLSI Symposium, pp. 35–41.

⊘ : Accessible Connection Points
○ : Turn Points
● : Connection Nodes

Horizontal & Vertical Track Grid Lines

———— : Intra Connections within Each Block (4 Bins in Each Block)

▬▬▬▬ : Inter Connections Across Block Boundaries

— — — : Intra-Bin (4 in a Block, 16 Bins Total) Connections

× : Pin at Top Level

□ : Pin That Was Previously Connected Before Last Step

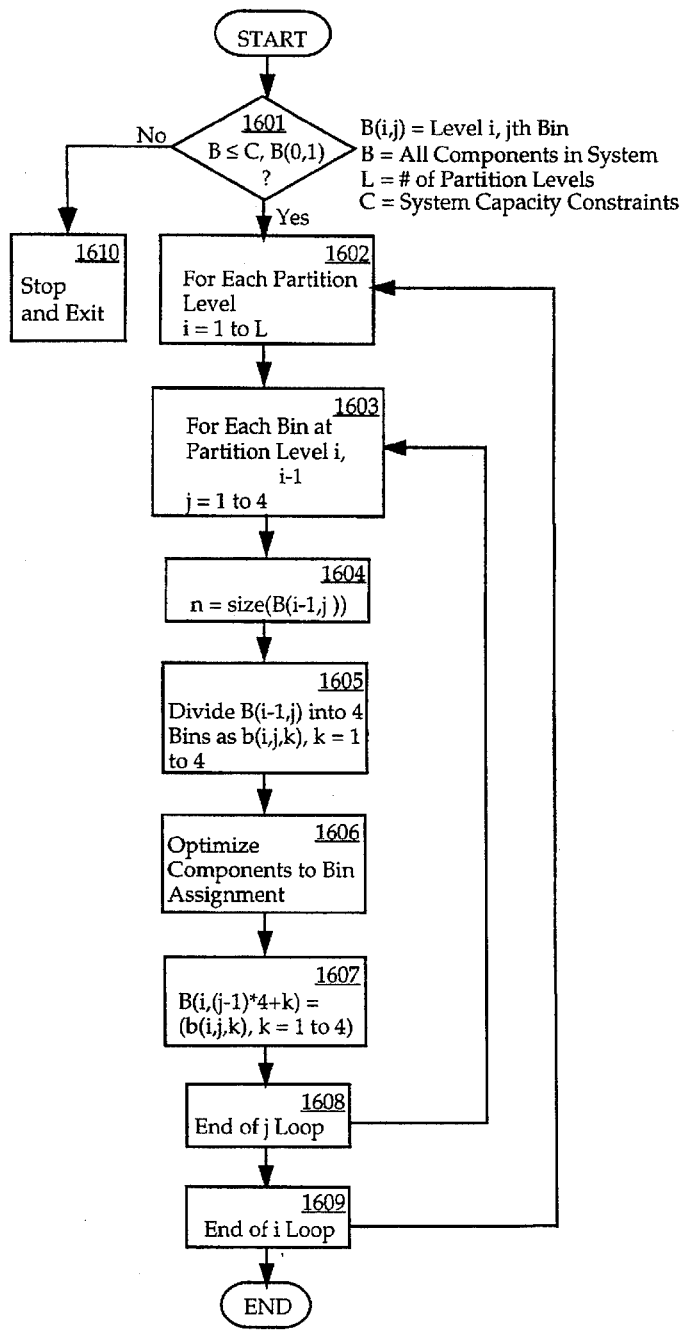
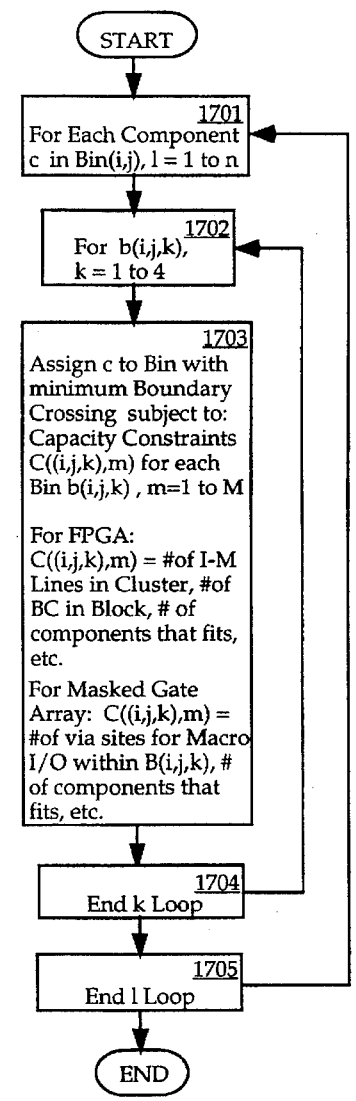
FIG. 16
FIG. 17

APPARATUS AND METHOD FOR PARTITIONING RESOURCES FOR INTERCONNECTIONS

This is a continuation of application Ser. No. 08/186,770, filed Jan. 25, 1994, now abandoned.

FIELD OF THE INVENTION

The present invention pertains to the field of interconnections for coupling together system components. More particularly, the present invention pertains to an apparatus and method for the partitioning, placing, and routing of electrical components with fixed and variable resources.

BACKGROUND OF THE INVENTION

In the past, electronic circuits were primarily comprised of individual, discrete components, such as transistors, resistors, capacitors, inductors, etc. Typically, these components were separately hardwired or soldered onto a printed circuit board to produce the desired output signals when properly stimulated with the desired input signals. With the advent of integrated and hybrid circuits, several of these different components can be fabricated onto a single semiconductor chip. Rapid advances in VLSI technology have led to ever faster, larger, and denser chips. Today, a complex chip can contain upwards of millions of transistors and other related components. As can be imagined, the design for properly interconnecting all these components can be very challenging. It is especially challenging to perform the interconnection as efficiently as possible, so as to minimize the chip's die size. A smaller die size means that more dies (i.e., chips) can be fabricated out of a given wafer, which directly translates into lower production costs. Further complicating matters is the fact that a large number of highly complex chips can be incorporated onto a single, multi-layered printed circuit board or as part of multiple chips modules.

The problems associated with interconnections are particularly pertinent with respect to programmable ICs, and field programmable gate arrays. These devices can have up to tens of thousands of gates which can be programmed to effect a desired circuit. Because of their programmable nature, a majority of their die size is consumed by an interconnection matrix and hence, representing a significant part of the production cost.

SUMMARY AND OBJECTS OF THE INVENTION

The present invention pertains to an apparatus and method for determining how to interconnect a plurality of components of a system, given a limited number of interconnect resources available to a device. First, it is determined whether the system meets the capacity constraints of the device. If the requirements exceed the capacity, a larger device is necessary. Otherwise, a topmost level of interconnection model is established.

This topmost level is partitioned into four different partitions. The components are assigned and optimized to these four partitions. Next, a lower level of interconnection model is established independently for each one of these four partitions. Each of these lower levels are, in turn, partitioned into four different, smaller partitions. Components are then assigned and optimized to these partitions.

This process is repeated for even lower levels until the granularity of the interconnection model of the system can not be further divided or partitioned. Hence, the estimated interconnection length of any partition of any given level is approximately equal to twice the length of a partition of the next lower level and half the length of a partition of the next higher level. By thusly dividing each level into four equal partitions, the present invention applies a two-dimensional approach to solving interconnection problems. Thereupon, the components are physically interconnected from the lower levels to the topmost level according to the routing pattern that had been established.

BRIEF DESCRIPTION OF THE DRAWINGS

The present invention is illustrated by way of example, and not by way of limitation, in the figures of the accompanying drawings and in which like reference numerals refer to similar elements and in which:

FIG. 16 shows the flow chart describing the steps for the top down partition process associated with the divide-by-four method.

FIG. 17 is a flowchart describing the steps for optimizing bin assignments.

DETAILED DESCRIPTION

An apparatus and method for partitioning resources for interconnections is described. In the following description, for purposes of explanation, numerous specific details are set forth, such as components, nodes, layers, boundaries, matrices, etc., in order to provide a thorough understanding of the present invention. It will be obvious, however, to one skilled in the art that these specific details need not be used to practice the present invention. In other instances, well-known structures and circuits have not been shown in detail in order to avoid unnecessarily obscuring the present invention.

Figure 2:
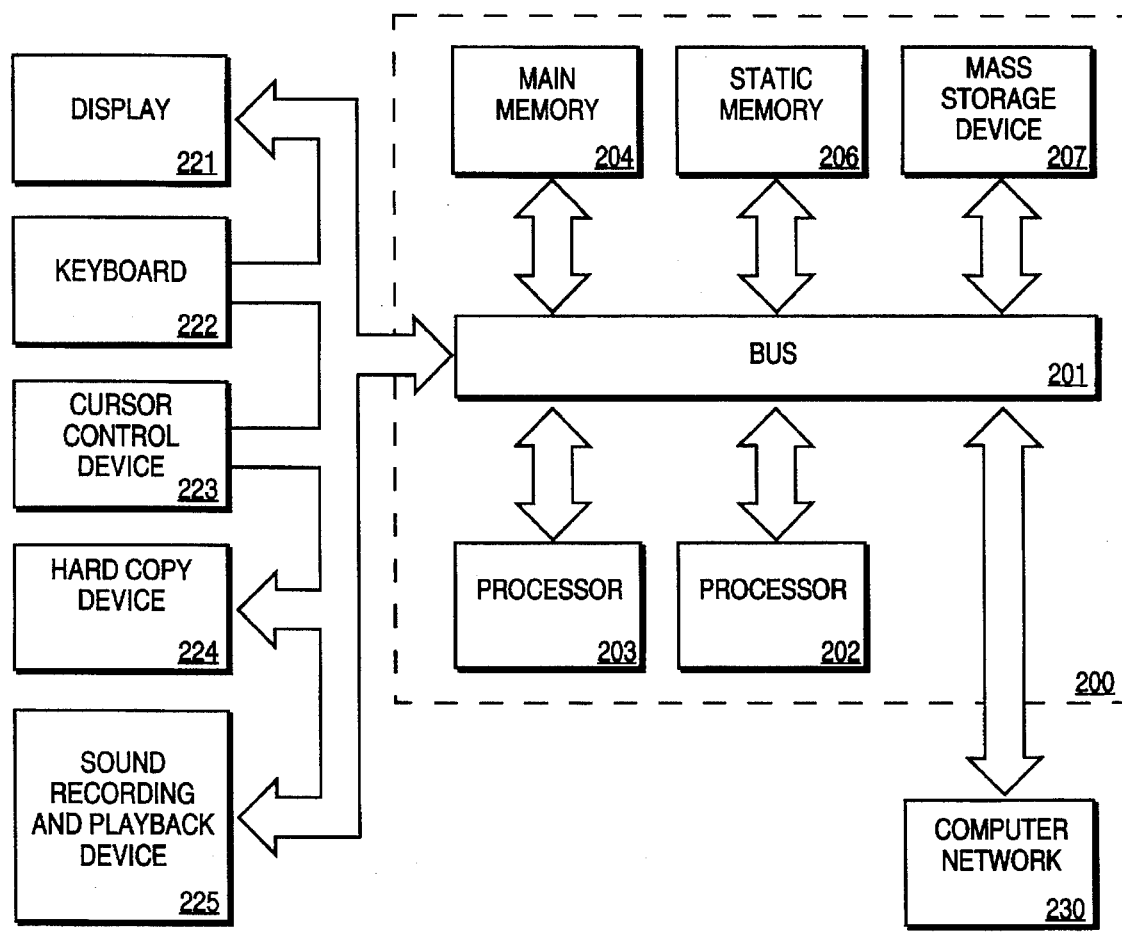
FIG. 2 shows a typical computer network system upon which the present invention may be utilized.

Referring to FIG. 2, a typical computer network system upon which the present invention may be utilized is shown as 200. Computer system 200 comprises a bus or other communication means 201 for communicating information, and a processing means 202 coupled with bus 201 for processing information. In one embodiment, multiple processors (e.g., digital signal processor 203) can be implemented. System 200 further comprises a random access memory (RAM) or other dynamic storage device 204 (referred to as main memory), coupled to bus 201 for storing information and instructions to be executed by processor 202. Main memory 204 also may be used for storing temporary variables or other intermediate information during execution of instructions by processor 202. Computer system 200 also comprises a read only memory (ROM) and/or other static storage device 206 coupled to bus 201 for storing static information and instructions for processor 202. Data storage device 207 is coupled to bus 201 for storing information and instructions.

Furthermore, a data storage device 207 such as a magnetic disk or optical disk and its corresponding disk drive can be coupled to computer system 200. Computer system 200 can also be coupled via bus 201 to a display device 221, such as a cathode ray tube (CRT), for displaying information to a computer user. An alphanumeric input device 222, including alphanumeric and other keys, is typically coupled to bus 201 for communicating information and command selections to processor 202. Another type of user input device is cursor control 223, such as a mouse, a trackball, or cursor direction keys for communicating direction information and command selections to processor 202 and for controlling cursor movement on display 221. This input device typically has two degrees of freedom in two axes, a first axis (e.g., x) and a second axis (e.g., y), which allows the device to specify positions in a plane.

Another device which may be coupled to bus 201 is hard copy device 224 which may be used for printing instructions, data, or other information on a medium such as paper, film, or similar types of media. Additionally, computer system 200 can be coupled to a device for sound recording and/or playback 225 such as an audio digitizer coupled to a microphone for recording information. Further, the device may include a speaker which is coupled to a digital to analog (D/A) converter for playing back the digitized sounds. Finally, computer system 200 can be a terminal coupled to a computer network 230 (e.g., a LAN).

Figure 3:
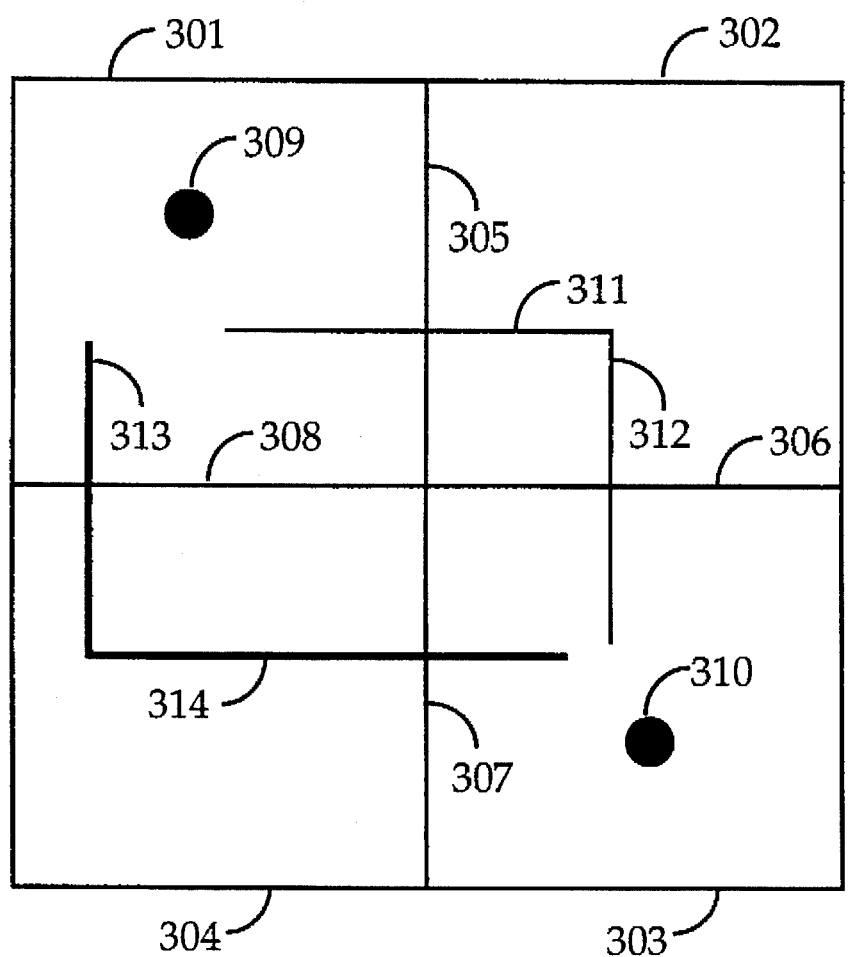
FIG. 3 shows the currently preferred embodiment, whereby a divide-by-four approach is used.

FIG. 3 shows the currently preferred embodiment, whereby a divide-by-four approach is applied to electrical systems components interconnections that can be modeled as a 2-D problem. In this case, when node 309 is partitioned into bin 301, and node 310 is in Bin 303. The boundary crossing lines 311 and 312 (crossing boundaries 305 and 306, respectively) denote a preferred route for connecting nodes 309 and 310. Note that in this partition process, there is no connection node inside bin 302 for the net associated with nodes 309 and 310. An alternative route that can be used is shown by the dark lines 313 and 314 (crossing boundaries 308 and 307, respectively). In the present invention, the particular way of modeling the partition problem is that each bin actually has a physical location with respect to each other. This is in contrast to the prior art divide-by-two approach whereby each of the partitioned bins and their subsequent bins are simply represented as nodes, and the estimated connections are directly measured with respect to each other. In the present invention, given a connection between two diagonal bins with the absence of connection to the corner bins, the diagonal bins have a physical representation of an "L" shaped connection pattern which passes through one of the corner bins. This is clearly illustrated by either line pair 311–312 or line pair 313–314.

With the divide-by-four method of the present invention, the boundary crossing estimate can be accurately represented once the preferred boundary crossing is defined. This approach can be extended to three dimensional problems, whereby a logical representation of a system is to be mapped or partitioned into a physical domain. An example of the three dimensional problem would be piping or facility layout design in a system with the requirement that the connections of all the pipes or facilities need to be confined in a minimal area with 100% connections while conforming to design constraints. The divide by four method of the present invention will be described in detail below in reference to interconnection problems commonly seen in the Integrated Circuits, Multiple Chips Modules, and PCB Layouts.

In short, the interconnection problem is that, given a set of components with input/output access ports and a set of interconnect resources which may be fixed or flexible, how to best position those components so they can be one hundred percent routed while subject to some area constraints, optimization criteria, and architecture restrictions. Prior art approaches to this interconnection problem involve a divide and conquer strategy. The interconnection problem is divided into three separate steps: Partition, Placement, and Routing. Typically, the first phase is to group or "partition" the components into several parts. Each of these parts is called a "bin." The components are assigned to the bins based on some optimization objectives and design constraints such as the number of connections among partitions being minimized. Next, each partition is formulated separately by additional partitioning steps. The components within each bin are then assigned into the next level of partitions. Sometimes the components within each partition can be placed into an un-related partition according to certain objectives, such as minimizing the overall estimated wire lengths within all partitions. An interconnection or routing phase is then used to connect those components together within each partition in accordance with certain optimization objectives, such as minimum routing area. A final placement and routing phase is then used to connect across these partitions.

There maybe iterative steps involving the optimization of the partition, placement, and routing steps. Oftentimes, an iterative exchange procedure is executed, whereby the effects of putting a component into various partitioned bins are measured, and the bin with the best measure is selected (see B. W. Kernighan and S. Lin, "An Efficient Heuristic Procedure for Partitioning Graphs", The Bell System Technical Journal, February 1970, pp. 291–307). During the routing phase, some sort of global routing estimate with an iterative algorithm may be applied to route those connections crossing the partition boundaries so that traffic is distributed evenly without exceeding the allowable traffic crossing between these boundaries.

In the prior art, the partition process used a divide-by-two method, wherein the interconnection problem was modeled as a "bipartite graph." In the divide-by-two method, the components in a system are divided into two parts. Only those connections crossing the boundary of the two parts are considered. The connections within each part is ignored, and the objective in the partition is usually some type of minimization criterion (e.g., a minimum number of connections or some weighted sum of connection measures between the two parts). This procedure is called "min-cut." Some iterative exchange steps can be applied to improve the partition results with respect to the problem formulation. This divide-by-two partition approach has several shortcomings. Namely, the analysis tends to be "one-dimensional," in that the partition crossing estimates are generally inaccurate and are dependent upon previous partition information.

Figure 1A:
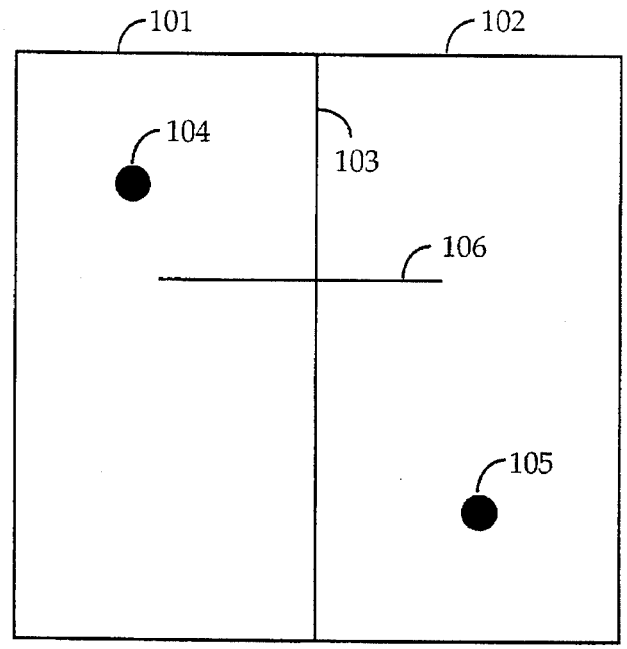
FIG. 1A shows an example wherein part of a system is partitioned into two bins.
Figure 1B:
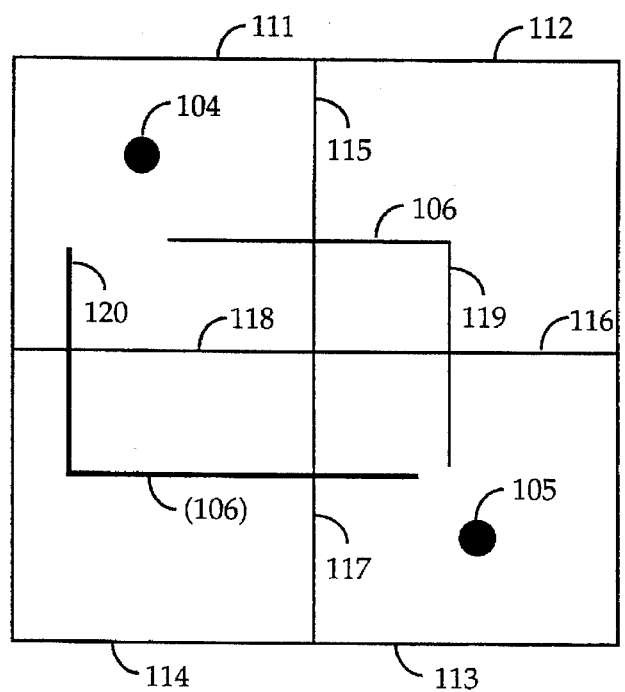
FIG. 1B shows the second level of the divide-by-two partition.

FIG. 1A shows an example wherein part of a system is partitioned into two bins 101 and 102. Two connection nodes 104 and 105 reside within bins 101 and 102, respectively. The two nodes 104 and 105 belong to the same net (i.e. they are to be connected together). The connection is represented by a line 106 crossing the boundary 103 between bins 101 and 102. FIG. 1B shows the second level of the divide-by-two partition. Bin 101 of FIG. 1A is divided into bins 111 and 114, and bin 102 of FIG. 1A is divided into bins 112 and 113. This results in four boundaries 115, 116, 117, and 118. Note that since nodes 104 and 105 are in bins 111 and 113, the line 119 crossing boundary 116 and line 120 crossing boundary 118 can not be accounted for by the partition process described in the step shown in FIG. 1A. This is because there is no knowledge (e.g., there is no node in bin 111 connecting to node 105 in 113 nor is there any node in bin 114 connecting to node 104 in bin 111) relating to connection requirements between bins 112 and 113 with respect to node 105 and also bins 111 and 114 with respect to node 104. Thus, the divide-by-two method is flawed because lines 119 and 120 are not factored in the estimation process.

The reason why the classical divide-by-two method is inadequate is due to the fact that it is a one dimensional approach and is more suited for linear array type situations. However, interconnection problems essentially deal with a multiple number of two dimensional problems concerning the placing and routing of components. Consequently, the divide-by-two method results in loss of information and, thus, a lack of precision in arriving at an efficient physical implementation. Thus, there is a need in the prior art for a partition method to solve the electronics interconnections problems typically encountered in integrated circuits, multiple chips modules, printed circuit boards, etc. It would be preferable if such a process were to use multiple levels of hierarchical interconnect models and consider the partition bins as having physical meaning with resources constraints, instead of considering the process as a graph theoretical model. It would also be preferable if such a process allows many levels of partitions, where each level of the partition process is independent of the other levels, thereby greatly simplifying the underlying problem. In addition, it would be highly preferable if such a process expands the partition process to consider not only the cross-partition connections but also simultaneously considers the resources requirements within each bin. This new process would allow a more accurate representation of the problem and a faster convergence in arriving at a solution.

There are different constraints and requirements during the partition process associated with the different interconnection problems. For example, in the Field Programmable Gate Array (FPGA) case, where the amount of logic and routing resources are very fixed, the partition consideration needs to account for both the boundary crossing requirements to match with the available capacity at each partition level and the logic, routing, and access resources available within each partitioned bin. For the Masked Gate Array (MGA) case, there can be some trade-offs among different levels in sizing up the boundary crossing needs at each partition level, even though the total routing resources is fixed. For the Multiple Chips Modules (MCM) case, the capacity at a certain level of partition may be fixed, while at some other levels they may be flexible. For example, in the MCM case, at the substrate level, the partition objective minimizes the amount of connections at the substrate while guaranteeing the success at the chips level.

The following discussion describes in detail two cases for connections problems with respect to: 1) Fixed Resources connections applied to Field Programmable Gate Arrays and 2) Flexible Resources connections applied to Masked Sea of Gates Gate Arrays. The applications of the present invention are not exclusive to the above two examples. For instance, the present invention can be applied to Multiple Chip Modules, wherein either fixed or flexible resources model can be used or in Printed Circuit Boards wherein a mixture of fixed and flexible resources are used.

In the fixed resources case for FPGA applications, a given chip can be considered or modeled as having multiple levels of routing resources that is fixed at each level of interconnections. In addition, the capacities available to accommodate logic and the accessing resources available are also fixed within each partitioned bin at any given level of interconnections. A more detailed description of an FPGA interconnection scheme can be found in the patent application Ser. No. 08/101,197, entitled "Architecture and Interconnect Scheme for Programmable Logic Circuits", filed on Aug. 3, 1993.

Figure 4:
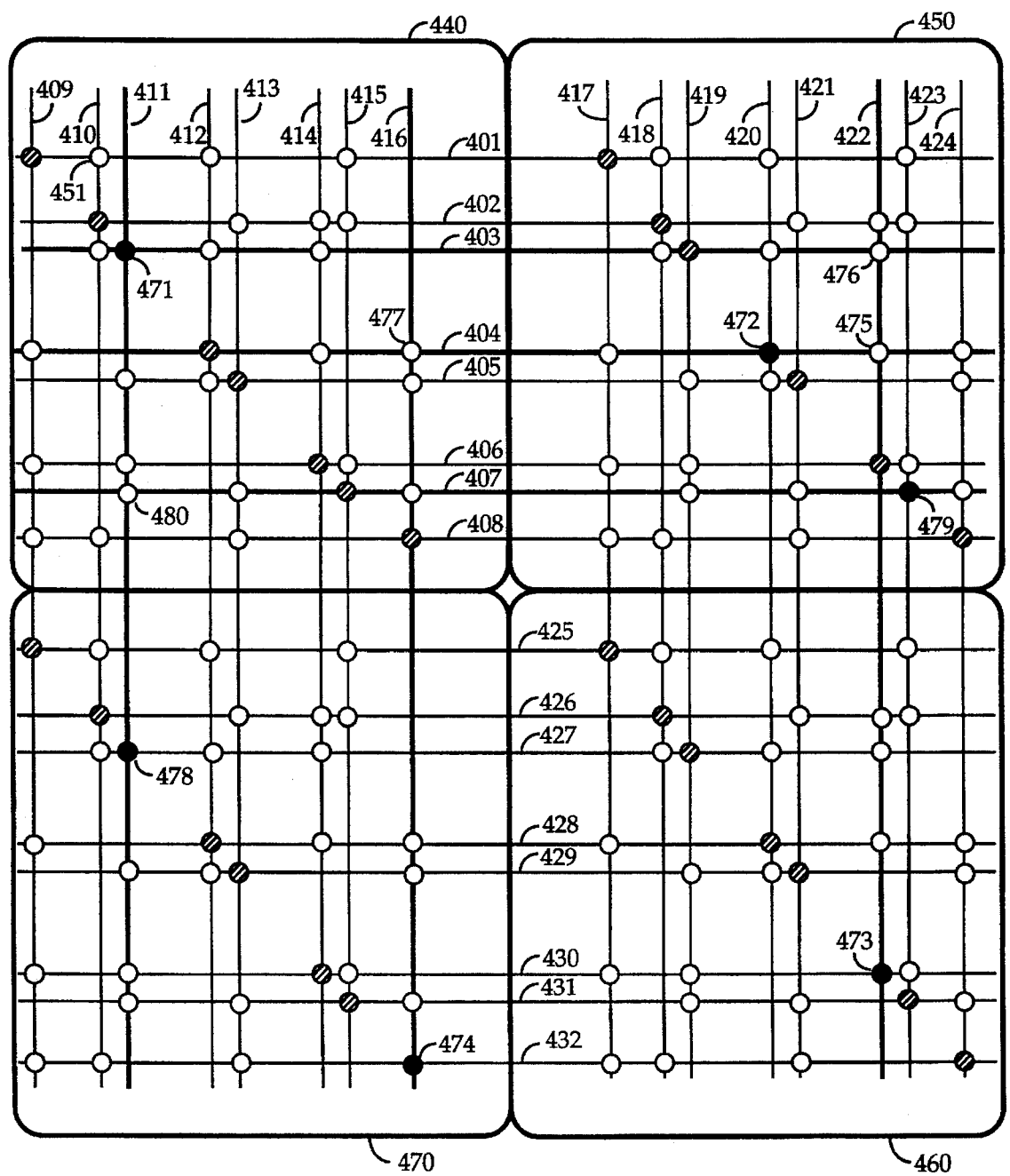
FIG. 4 shows the first level of a Multiple Level Architecture (MLA) routing network having four blocks.

FIG. 4 shows the first level of a Multiple Level Architecture (MLA) routing network having four blocks 440, 450, 460, and 470 are shown. Also shown are sixteen horizontal routing lines 401–408 and 425–432; and sixteen vertical routing lines 409–424. Each of these lines crosses a boundary between two adjacent blocks. Each of the first level of MLA routing resources span two blocks (e.g. the length of the system under consideration), both vertically and horizontally. The open circles denote turn points where a horizontal line can connect to a vertical line. For example, lines 401 and 410 can be connected by selecting the open circle 481 at the intersection point as the turn point. The shaded circles denotes potential connection or accessing nodes. Some of those nodes might not have any connections within the four blocks region. Instead, they are to be connected to other nodes outside the region by accessing and using higher levels of interconnection matrices (not shown in FIG. 4). Each of the nodes can connect to either a horizontal line, a vertical line, or both lines at the intersection point. Connection nodes 471, 472, 473, and 474 can be connected together via lines 403, 422, 404, and 416 by selecting turn points 475, 476, and 477. Essentially, node 471 is connected to line 403; node 472 is connected to line 404; node 473 is connected to line 422; and node 474 is connected to line 416. Similarly, connection nodes 478 and 479 are connected by selecting turn point 480 and connecting lines 411 and 407. Note that node 471 does not share connection with line 411, even though the line runs through node 471 as drawn. It should also be noted that each shaded node indicates an accessing point to the two lines underneath and does not represent a connection point until selected. In addition, only interconnections crossing 440, 450, 460, and 470 boundaries and within the four blocks need to be considered. There are eight such nodes available in each block.

Figure 5:
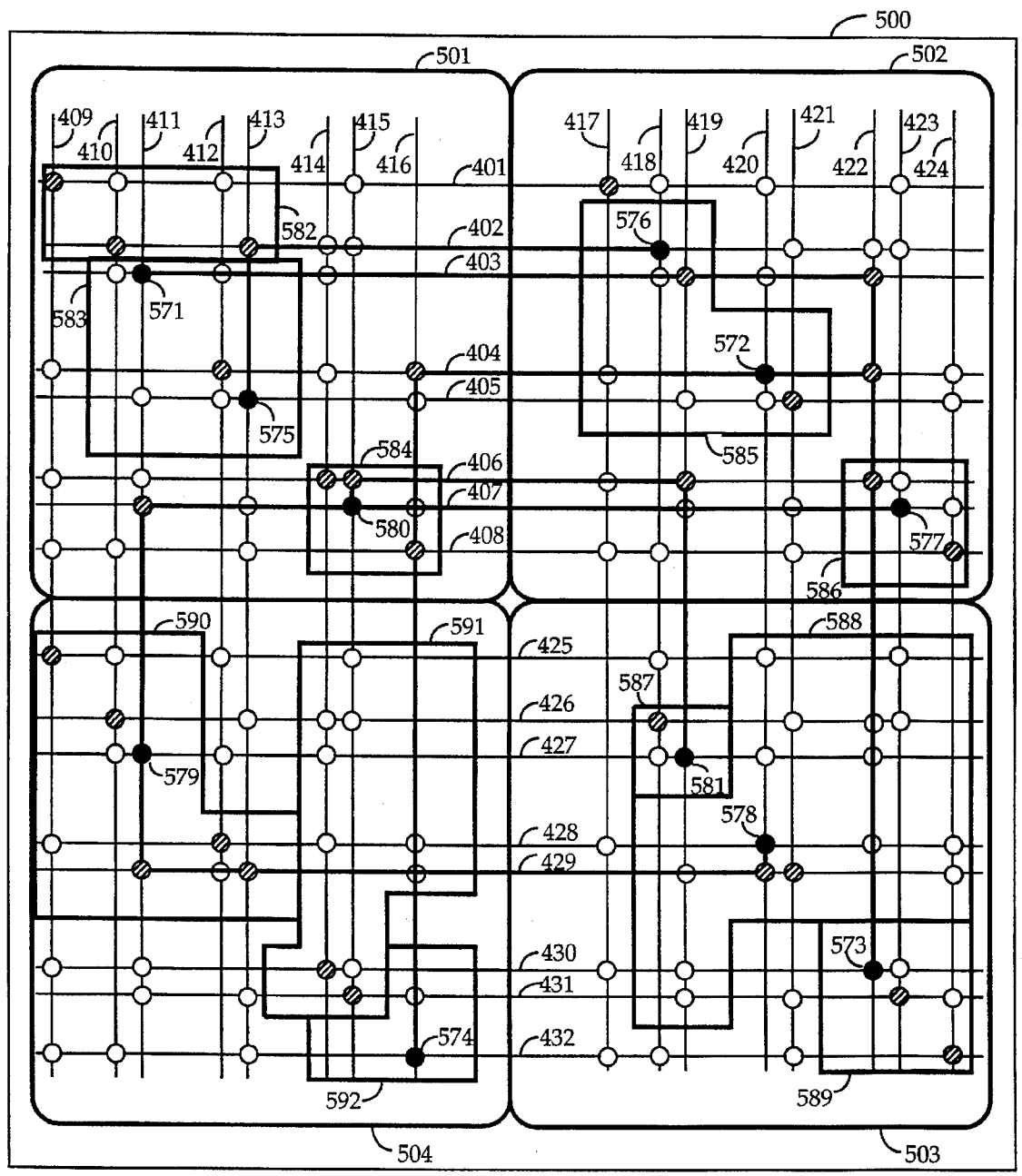
FIG. 5 shows an example with the top level 500 being the system.

A top-down approach is applied, wherein the components are yet to be fixed in location. The following discussion describes a process whereby successively dividing the system into four parts, interconnect requirements can be measured at each level of the division. FIG. 5 shows an example with the top level 500 being the system. The system is divided into four parts: 501, 502, 503, and 504. Components 582–592 are to be placed inside the system. Routing resources for the highest level is shown by routing lines 401–432. Turn points are denoted by the open circles and shaded circles are potential access nodes. At this highest level of interconnection layer, the problem to be solved is to partition the components into four groups such that those interconnections crossing the boundaries of 501–504 can fit into the routing resources available at that level. There are four nets {(571, 572, 573, 574), (575, 576), (577, 578, 579), (580, 581)} crossing the boundaries given the following groupings: 582–584 inside 501; 585, 586 inside 502; 58–589 inside 503; and 590–592 inside 504. During the partition stage, there is no specific placement location for each of the components within each group, 501–504. The components are "grouped" inside each bin. However, the interconnection requirements crossing the boundaries of the four groups 501–504 can be readily ascertained with the four nets indicated above. One can then "estimate" the routing resources required to route those nets. For example, in FIG. 5 there are eight crossing allowed for each boundary. One can use the following range as estimates: one to one and a half crossing is required to cross a boundary for each node pair. Applying this estimate to the example shown in FIG. 5 gives:

Net (571, 572, 573, 574): [1, 1.5] crossing is needed for each of the four boundaries.

Net (575, 576): [1, 1.5] crossing is needed for boundary between (501, 502).

Net (577, 578, 579): [1, 1.5] crossing is needed for boundaries (501, 502), (501, 504), and (503, 504).

Net (580, 581): [1, 1.5] crossing is needed for boundaries (501, 502), and (502, 503).

Since the capacity at each crossing is eight and the worst case requirement is for boundary (501, 502) where four to six ([4, 6]) crossings are required, the partition would assure high connectivity for this highest level of interconnect. Thus, the first step of the partitioning process of the currently preferred embodiment is to partition the system into four parts with estimated crossings over the boundaries to fit into the capacity available such that the total estimated crossing is minimized. Next, each of the four parts above is treated as the system and the above steps are repeated until the desired resolution is achieved (e.g., the lowest level of routing resources can be estimated). In the FPGA case, this lowest level would be the I-Matrix intraconnection lines (as routing resources and cells organized in clusters as logic resources). An example is now offered to show the process described as applied to a variation of the FPGA architecture.

Figure 6:
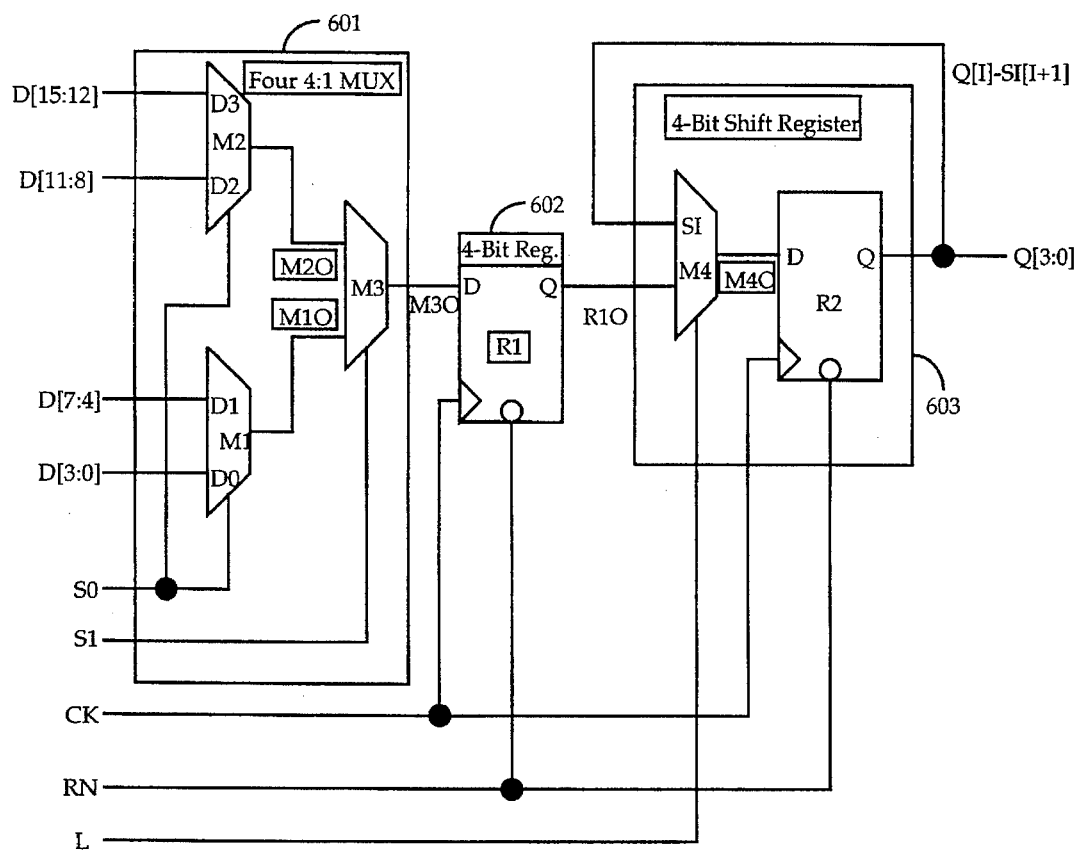
FIG. 6 shows a circuit comprised of a 4:1 multiplexer, a 4-bit register, and a 4-bit shift register.

FIG. 6 shows a circuit comprised of a 4:1 multiplexer 601, a 4-bit register 602, and a 4-bit shift register 603. The circuit shown is that of a "four bit datapath" design, whereby each bit is logically identical to each other. The design is implemented in four blocks. The topmost interconnection resources is the same as that described in FIG. 4. The first level of MLA corresponds to the top most routing resources under consideration. Furthermore, there are some global access lines which is not shown in the previous figures which serve two major functions. One is to act as a dedicated clock and reset lines for the flip-flops, while the other is used as input access lines for connecting multiple input nodes over several blocks.

Figure 7:
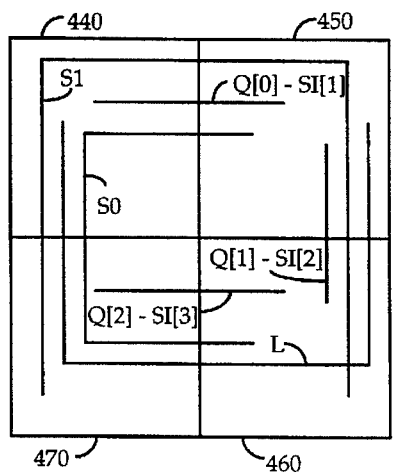
FIG. 7 shows that at the first step of partition for the schematic shown in FIG. 6, the logic for each of the four bits is grouped into the four partitions.

One of the basic assumptions is that every input and output node must be made accessible to the routing network during the partition process. At the first step of partition for the schematic shown in FIG. 6, the logic for each of the four bits is grouped into the four partitions 440, 450, 460, and 470 as shown in FIG. 7. In this case, the cross-the-boundary-connections are very few in numbers. The amount of logic for each bit is small compared to those available in each block. The limiting factor in this particular example is the number of access nodes required for each bit, which are quite high. It can be seen that the four bits are partitioned into four parts: Bit 0 resides within partition 440; bit 1 resides within partition 450; bit 2 resides within partition 460; and bit 3 resides within partition 470. S0, S1, and L are signals common to all the bits. They are shown to cross several of the boundaries. The signals CK and RN are also common to all the bits. However, in the currently preferred architecture, these two signals are "global." Hence, they are handled specially separate from the partition, placement, and routing process. In addition, the signal from output Q0 of bit 0 to the SI input of bit 1 (Q[0]-SI[1]) crosses the boundary between partitions 440 and 450. The signal from output Q1 of bit 1 to the SI input of bit 2 (Q[1]-SI[2]) crosses the boundary between partitions 450 and 460. The signal from output Q2 of bit 2 to the SI input of bit 3 (Q[2]-SI[3]) crosses the boundary between 460 and 470. Each of the bins 440, 450, 460, and 470 corresponds to a block which has eight block connectors or accessible connection points to connect to the inputs and outputs of the components. Furthermore, each four blocks vertically as a group share two signal lines that can be selected by the block connectors at the top block. Excluding the Clock (CK) and Reset (RN) signals, each bit has seven inputs (e.g., four data D[n:n+3] and three common selects S0, S1, L) and one output Q, with the exception that the first bit (i.e., bit 0) has an additional input SI. Each block contains more logic than required by a bit, but is limited by the number of block connectors available within the block. This completes the first level of the partitioning step.

Figure 8:
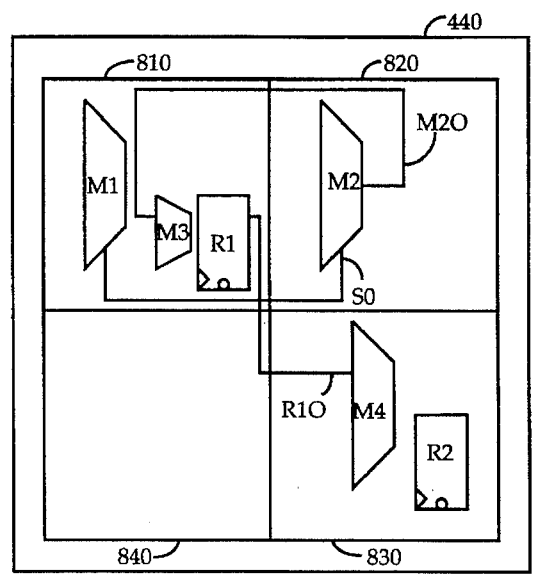
FIG. 8 shows a single bit of the circuit shown in FIG. 6 is partitioned into four clusters within each block.

In FIG. 8, a single bit of the circuit shown in FIG. 6 is partitioned into four clusters within each block. Specifically the bit 0 data path logic is partitioned into four parts wherein partition 840 has no logic components. Again, one can identify those signals which cross the boundaries among partitions 810, 820, 830, and 840. The two input MUXes M1 of partition 810 and M2 of partition 820 share a common control signal, S0, which in turn, drives the MUX M3 to form a 4:1 MUX. The signal M20 in partition 820 is the output of MUX M2 that drives MUX M3 in partition 810. Signal R10 is the output signal from Register R1 in partition 810, which drives the input of MUX M4 in partition 830. There are a limited number of I-Matrix lines for macro connections within and across each of the four clusters 810–840. Both MUXes M1 and M2 are horizontally separated into two different bins 810 and 820 in order to reduce the load on the I-Matrix lines. For each cluster or bin, there are four to six block connectors available for inputs and outputs. Otherwise, if the two MUXes are grouped within the same bin, the block connector resources will be strained. Similarly, components M4 and R2 are grouped into bin 830 to reduce the I-Matrix lines demands. Since the logic for each bit is identical, the above step can be repeated for each of the remaining bits independently. Thus, at the end of this partitioning stage, there will be a total of sixteen bins (i.e., sixteen clusters). This completes the second (and the last) level of partition.

Figure 9A:
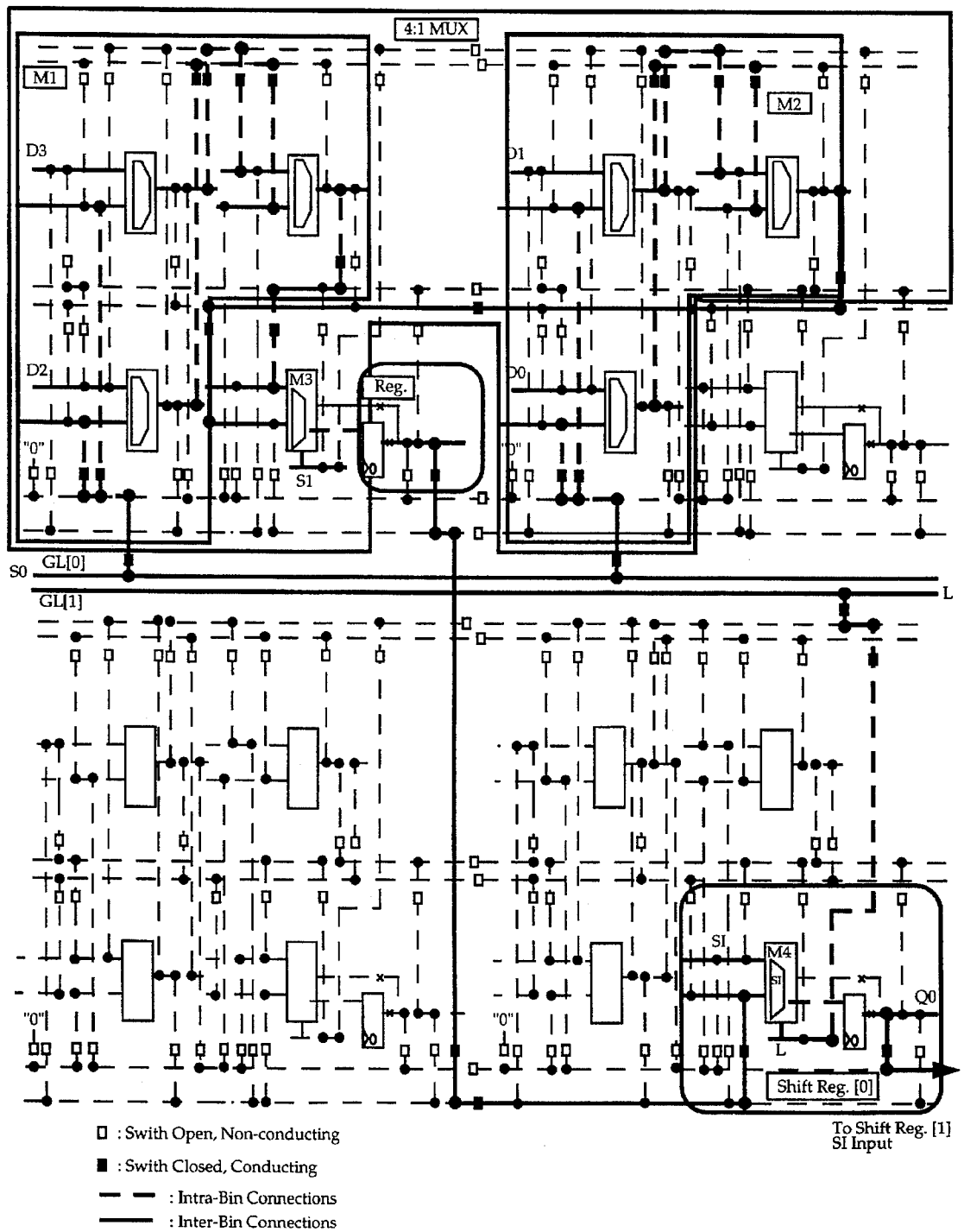
FIGS. 9A–D illustrate the actual logic gates placements and routing, given the partition described above and within each of the four groups as described in reference to FIG. 8.
Figure 9B:
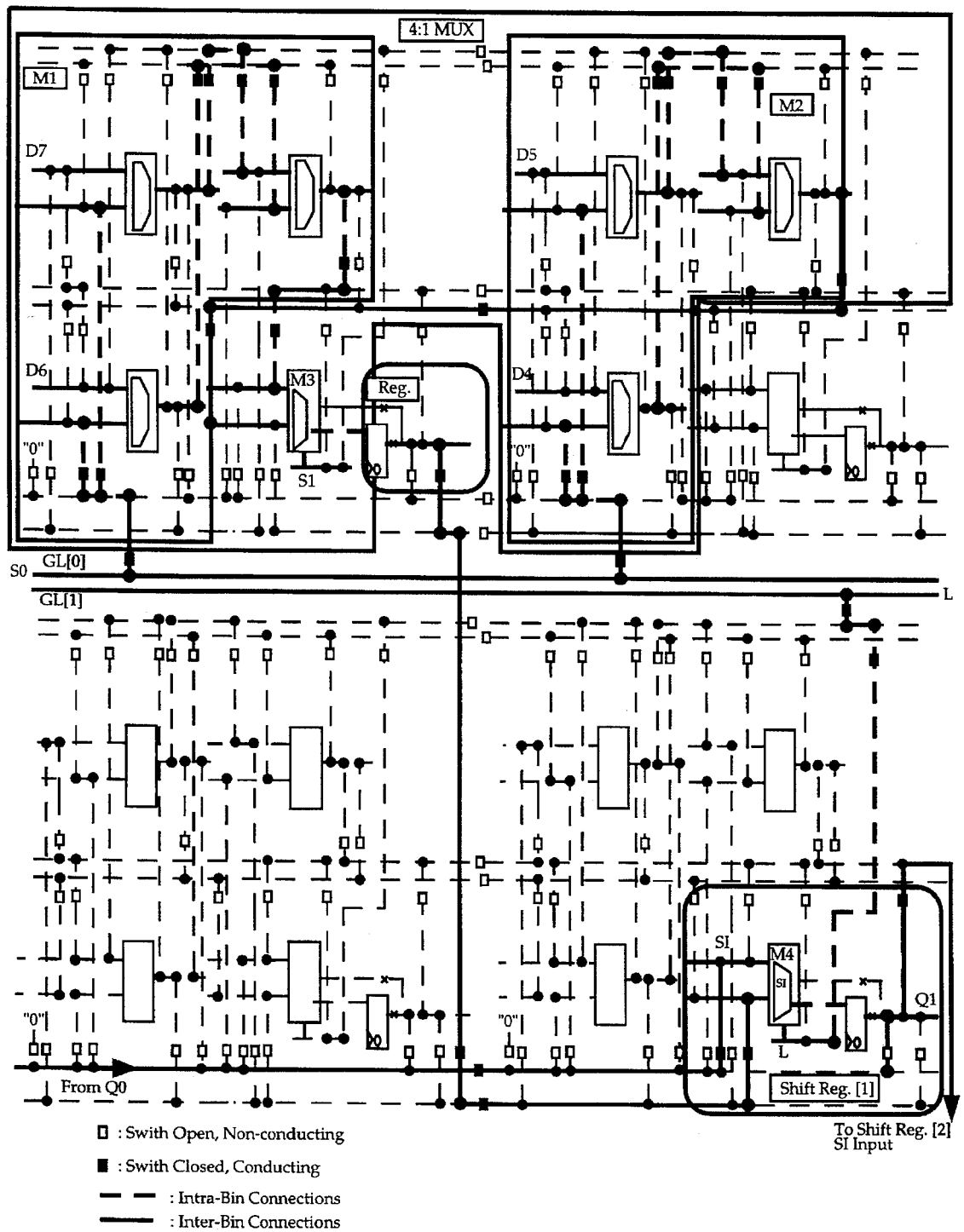
Figure 9C:
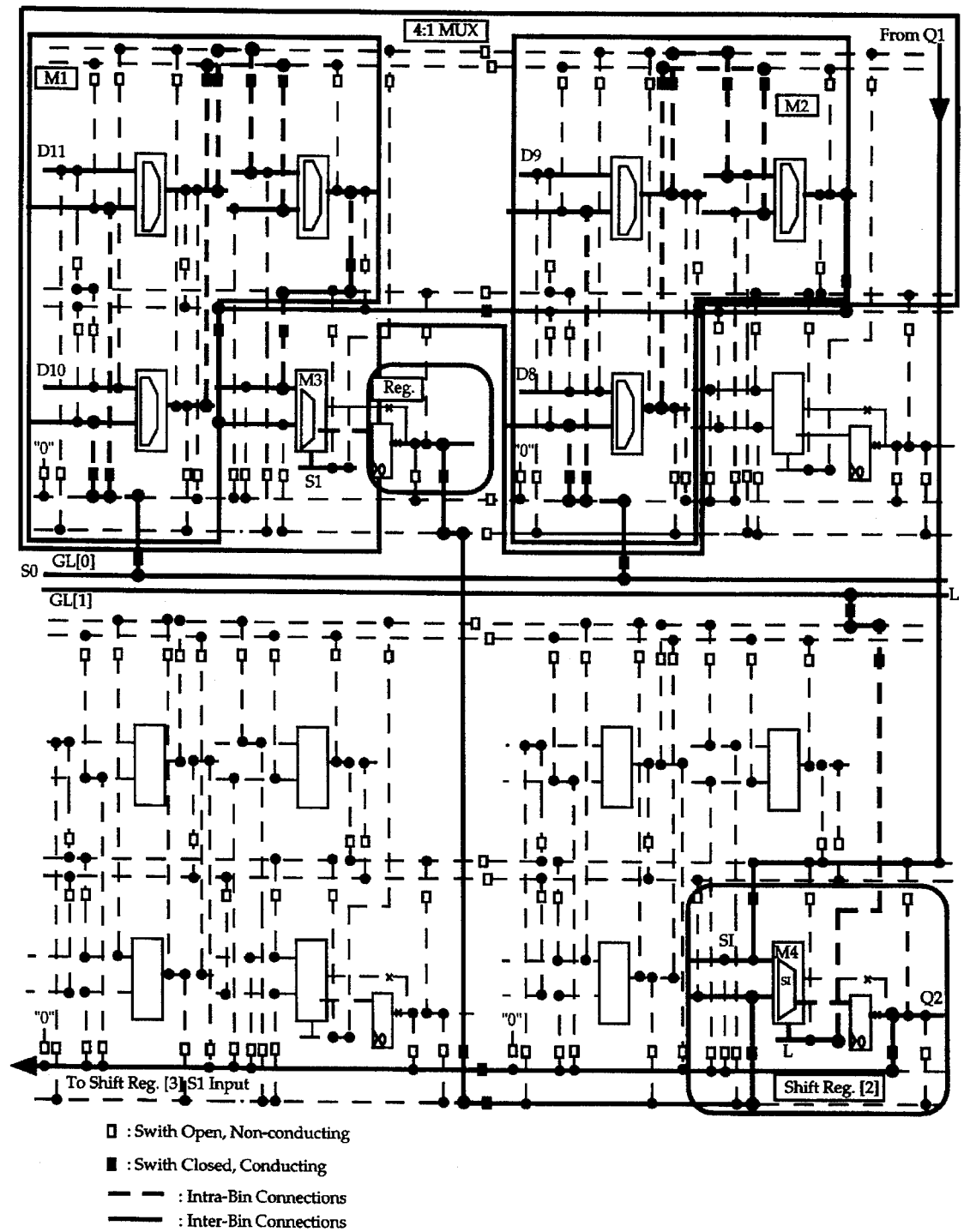
Figure 9D:
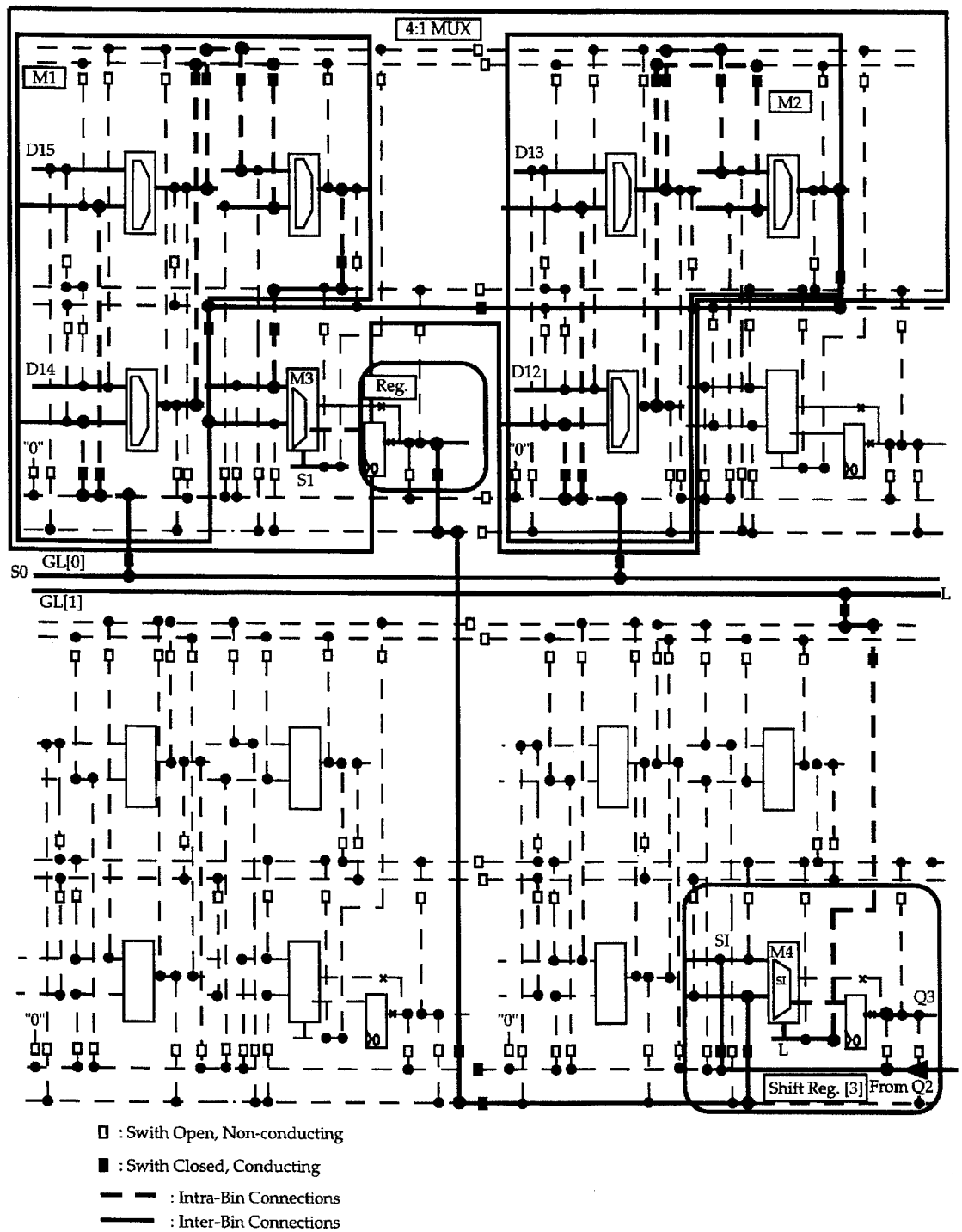

FIGS. 9A–D illustrate the actual logic gates placements and routing, given the partition described above and within each of the four groups as described in reference to FIG. 8. In particular, FIG. 9A depicts the placement and routing of the logic gates for bit0; FIGS. 9B for bit1; FIG. 9C for bit2; and FIG. 9D for bit3. The associated routes, both within each of the four bins (as shown in FIG. 8), those crossing the boundaries of the four bins (as shown in FIG. 8), and some of those crossing the boundaries of the four bins (as shown in FIG. 7) are depicted in FIGS. 9A–9D. A driving line GL[0] drives one of the I-Matrix lines, which in turn, drives some of the gates, thereby serving as the common S0 line. Similarly, GL[1] serves as the common control line L.

Figure 10:
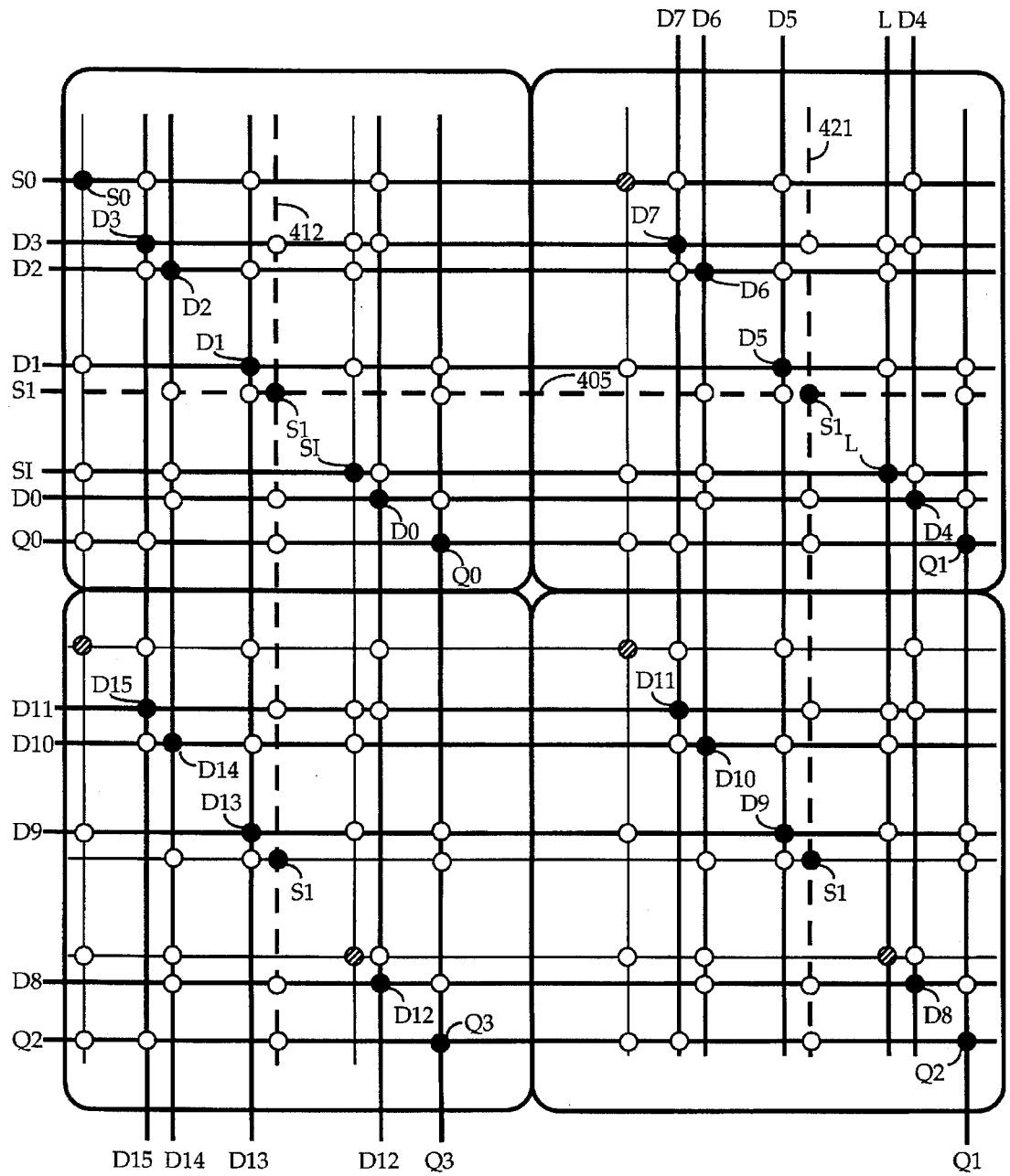
FIG. 10 depicts the corresponding connection nodes to be connected at the top most level of partition for propagating the required nodes remaining to be connected from FIGS. 9A–9D to the partitioned network described in FIG. 4.

FIG. 10 depicts the corresponding connection nodes to be connected at the top most level of partition for propagating the required nodes remaining to be connected from FIGS. 9A–9D to the partitioned network described in FIG. 4. Signals S0, L, Q[0]-SI[1], Q[1]-SI[2], Q[2]-SI[3] are already connected using routing resources at lower levels, the only routing necessary at the FIG. 10 level is signal S1. Routing lines 405, 412, and 421, shown as dotted dark lines in FIG. 10, are used to form the connections as dictated by the connection patterns shown in FIG. 7. In addition, dark lines are used to indicate connections of the sixteen data input signals D0–D15, eight output signals, Q0–Q7, and three control signals S0, S1, and L as I/Os to outside of system. The Clock and Reset signals, (CK and RN) are not shown because in FPGAs, they are specially handled with dedicated lines and I/O locations. Consequently, they need not be considered as part of capacity requirements.

Referring back to FIG. 7, each of the four partitioned bins 440, 450, 460, and 470 contains one-fourth the total logic area from the parent bin, which is proportional to the array area under study. Each boundary crossing span linearly over two bins, which is proportional to the length of the array under study. Similarly, in FIG. 8, the size of each of four partitioned bins for the next level is found to be inversely proportional to the array area of the parent bin, while the boundary crossing distance is inversely proportional to the length of the array of the parent bin. If one views each boundary crossing pattern as having potentially a maximum connection span of the combined lengths of the two abutting bins and overlays those patterns for all levels of partitions, one can arrive at an estimated bound for routing resources required over the total system. Thus, in the currently preferred embodiment, the partitioning process of the present invention divides the interconnect problem into multiple levels of two-dimensional routing resources models by utilizing a divide-by-four partition. At each level of the partition process, there is a set of routing patterns with routing length span approximately twice of those in the next level of partition and approximately half of those in the previous level.

Figure 11A:
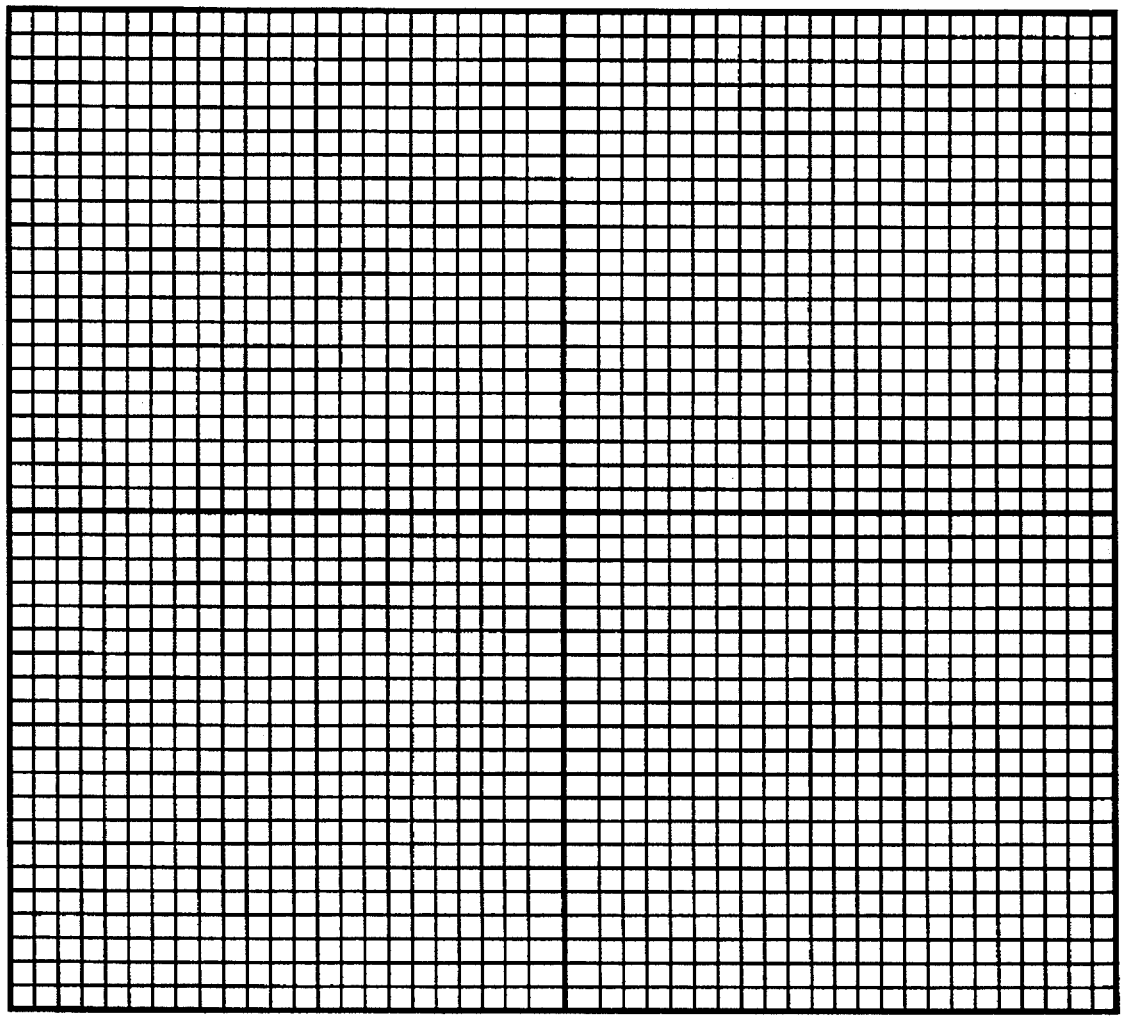
FIG. 11A shows a sample routing structure for a sea-of-gates masked gate array.
Figure 11B:
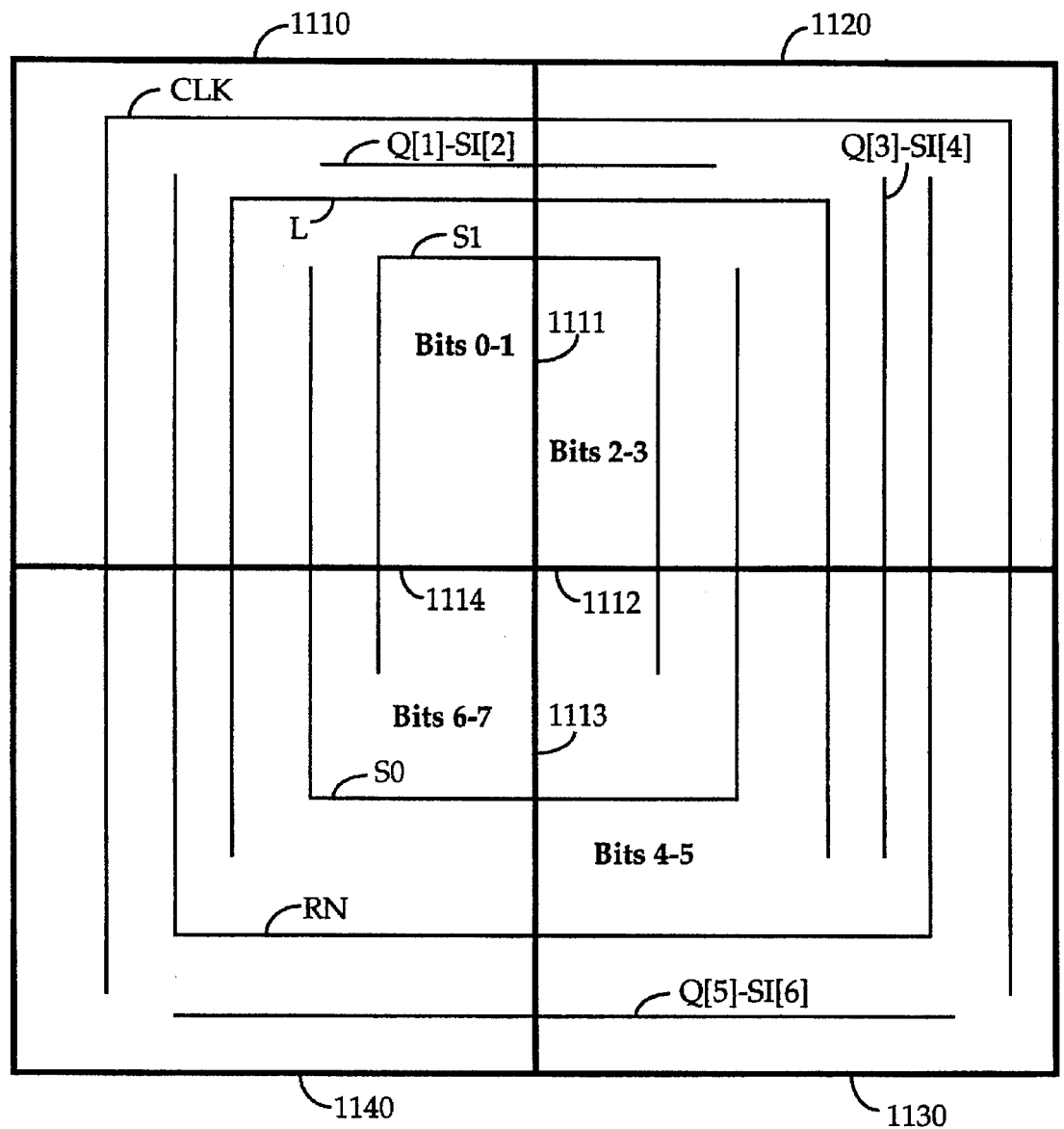
FIG. 11B shows the partitioning of the 8-bits data path into four bins.

Now, a modified example of FIG. 6 is used to illustrate this innovation as applied to a Masked Gate Array application. FIG. 11A shows a sample routing structure for a sea-of-gates masked gate array. As indicated by the horizontal and vertical grid lines two levels of routing are available. Furthermore, FIG. 11 shows a top view, wherein the system is first divided into four parts (i.e., four bins). The same design example of FIG. 6 is now used to illustrate the partitioning method as applied to a Masked Gate Array application. Instead of a four bits datapath (as shown in the FPGA case), the design is now considered to be 8-Bits. At the top system level, there are several input and output signals that must be accessed through the peripheral of the system boundary. Specifically, these I/O signals include thirty-two data input signals D[31:0], eight register output signals Q[7:0], and five common control signals S0, S1, CLK, RN, L. There are eighty horizontal grids and eighty-eight vertical grids at the top level (i.e., four copies of FIG. 11A). This is sufficient to handle forty-five signals. FIG. 11B shows the partitioning of the 8-bits data path into four bins. For the first level of partition, each of the four bins 1110–1140 has sufficient routing resources to guarantee internal routing success within each bin. The constraint or the limiting factor is the amount of logic that can be grouped together within each bin. Specifically, each bin has enough capacity for two bits of logic, but not for three bits. Thus, during the first step of partition, each bin contains logic components for two bits datapath. Specifically, Bin 1110 contains bits 0-1 of FIG. 6, Bin 1120, bits 2-3; Bin 1130, bits 4-5; and Bin 1140, bits 6-7. Once the components partition are completed, the next step is to look at those signals that crossed the bin boundaries. In this example, the signals are: signal CLK crossing boundaries 1111, 1112, and 1114; signal RN crossing boundaries 1112, 1113, and 1114; signal SO crossing boundaries 1112, 1113, and 1114; signal S1 crossing boundaries 1111, 1112, and 1114; signal L crossing boundaries 1111, 1112, and 1114; signal Q[1]-SI[2] crossing boundary 1111; signal Q[3]-SI[4] crossing boundary 1112; and finally, signal Q[5]-SI[6] crossing boundary 1113.

Figure 12:
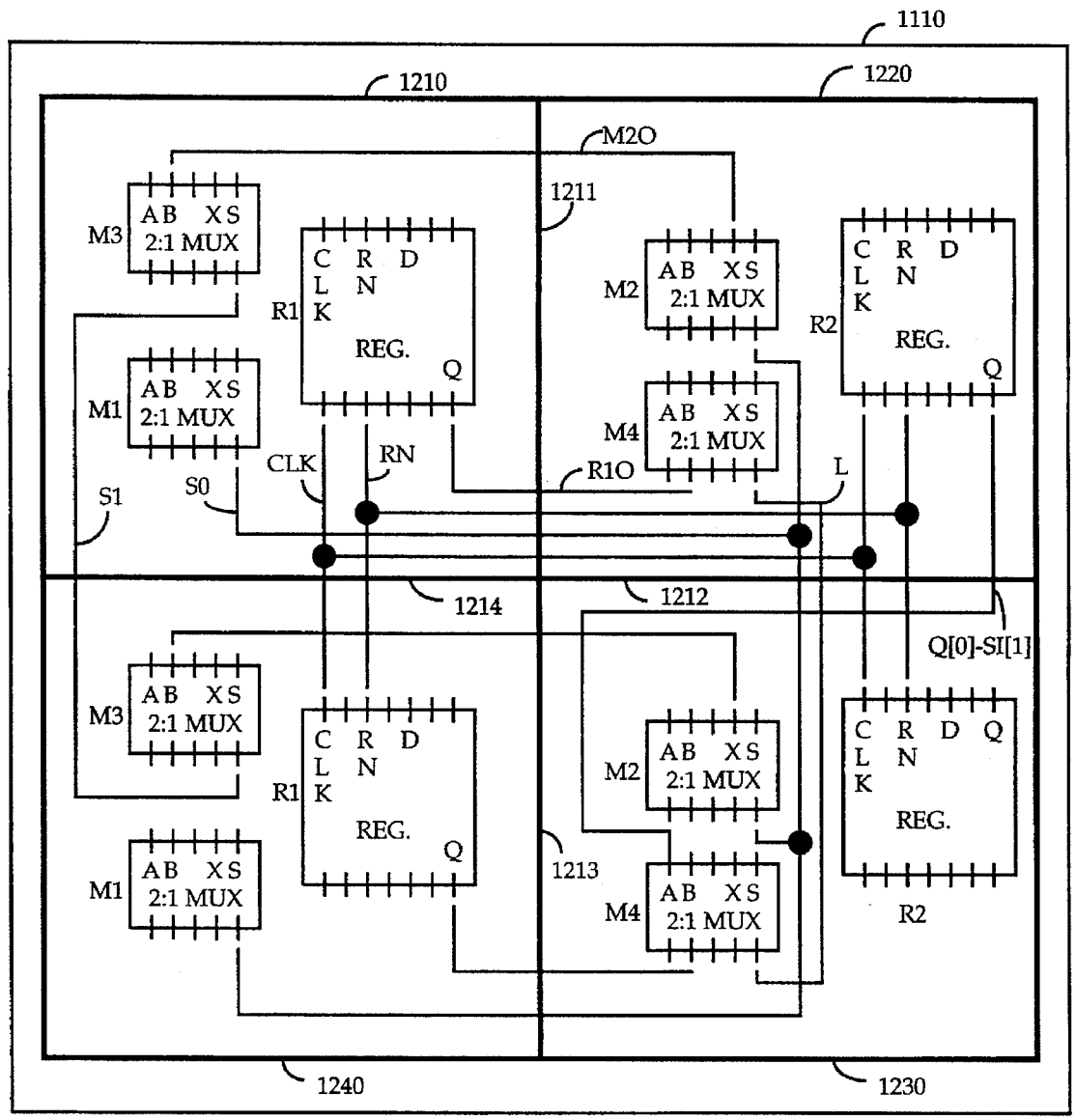
FIG. 12 shows the four second level bins for the first level partitioned bin, wherein logic components for bits 0–1 are grouped.

It should be noted that it is possible to iterate the "global routing" pattern for each signal crossing the boundaries to re-distribute the boundary crossing or to perform iteration among components within each of the four bins to minimize the boundary crossings. In this example, the only concern is to find a feasible solution. Since the only limitation in this example is the amount of components that can be fitted in a given bin, the boundary crossing is not a limiting factor for routing implementation. Once the partition and estimated boundary crossing of first level inter-bins connections patterns are completed, the next level of partition is performed. Namely, each of the four bins 1110–1140 are each divided into four bins, resulting in a total of sixteen bins. FIG. 12 shows the four second level bins for the first level partitioned bin 1110, wherein logic components for bits 0-1 are grouped. Again, there are four bins 1210–1240. Bit 0 logic is grouped into Bins 1210 and 1220, and bit 1 logic is grouped into Bins 1230 and 1240. Again, the cross-the-boundary connections are not the limiting factor. Rather, the major constraint is the amount of logic that can be fitted in any of the bins. Again, those signals that cross the boundaries 1211–1214 are determined. Signal CLK crosses boundaries 1211, 1212, and 1214; signal RN crosses boundaries 1211, 1212, and 1214; signal SO crosses boundaries 1211, 1212, and 1213; signal S1 crosses boundary 1214; signal L crosses boundary 1212; and signals Q[0]-SI[1] cross boundary 1212. In addition, for Bit 0, signal M2O crosses boundary 1211; and signal R1O crosses boundary 1211. Similarly, for Bit 1, signal M2O crosses boundary 1213; signal R1O crosses boundary 1213. It should be noted that the signal drawings of FIGS. 11B and 12 represent boundary crossings and do not represent actual connections at this stage.

Figure 13:
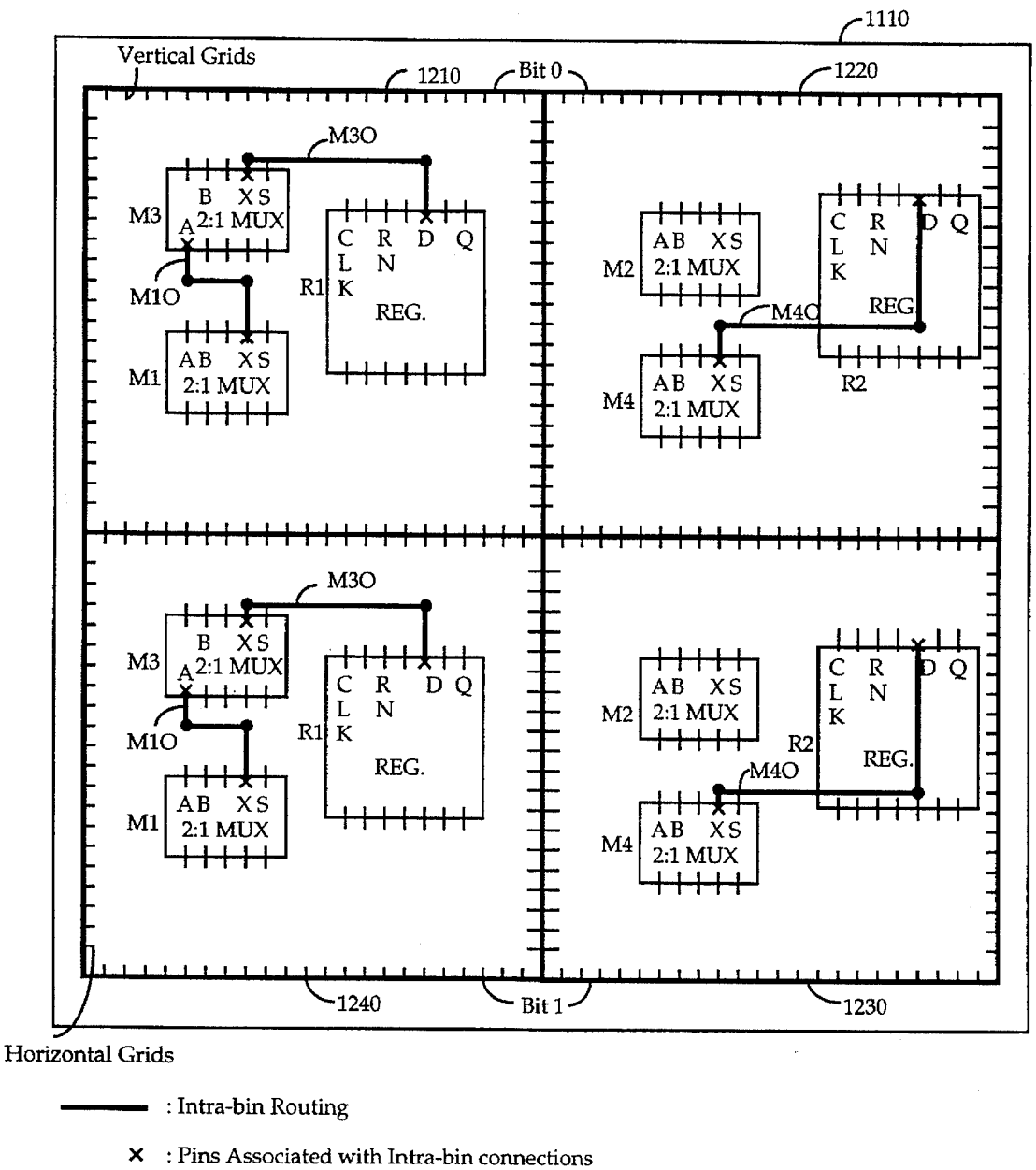
FIG. 13 shows each of the individual Bins.

FIG. 13 shows each of the individual Bins 1210–1240. For the sake of illustration, this level of partition is defined to be the lowest level. The physical layout is implemented from bottom-up to fix the component placement within each bin. Next, those signals within each bin are routed according to the routing grids shown in FIG. 13.

Both horizontal and vertical routing grids for each bin 1210–1240 are shown. Components M1 of Bit 0 is placed in Bin 1210, such that the intra-bin connection M1O connects pin X of M1 (2:1 MUX) to pin A of M3 (2:1 MUX). Signal M3O connects pin X of M3 to pin D of R1 (Bit[0] of 4-Bit Reg.). In Bin 1220, signal M4O connects pin X of M4 to pin D of R2 (Bit[0] of register of the 4-Bit Shift Register). Similarly, Bit 1 consists of Bins 1230 and 1240. In Bin 1240, signal M1O connects pin X of M1 (2:1 MUX) to pin A of M3 (2:1 MUX), and signal M3O connects pin X of M3 to pin D of R1 (Bit[1] of 4-Bit Reg.). In Bin 1230, signal M4O connects pin X of M4 to pin D of R2 (Bit[1] of register of the 4-Bit Shift Register). Inside each component, called a macro (e.g., M3 which is a two-to-one MUX), the pins A, B, X, S are double sided. This means that there are access locations at both the top and bottom grid points. Thus, looking at Bin 1240 in the connection for signal M1O, the pin A of M3 is accessed from below, while pin X of M1 is accessed from the top. The routing pattern of signal M4O inside Bin 1230 shows part of the connection patterns on top of component R2. This is allowed in sea-of-gates masked gate array technology where multiple levels of metals are available. Once the lowest level partition has been completed, and the placement of the components within each bin has been fixed, the next step is to route intra-bin interconnections bottom-up, as shown above in FIG. 13. When the lowest level routing is completed the partition level is upped by one.

Figure 14:
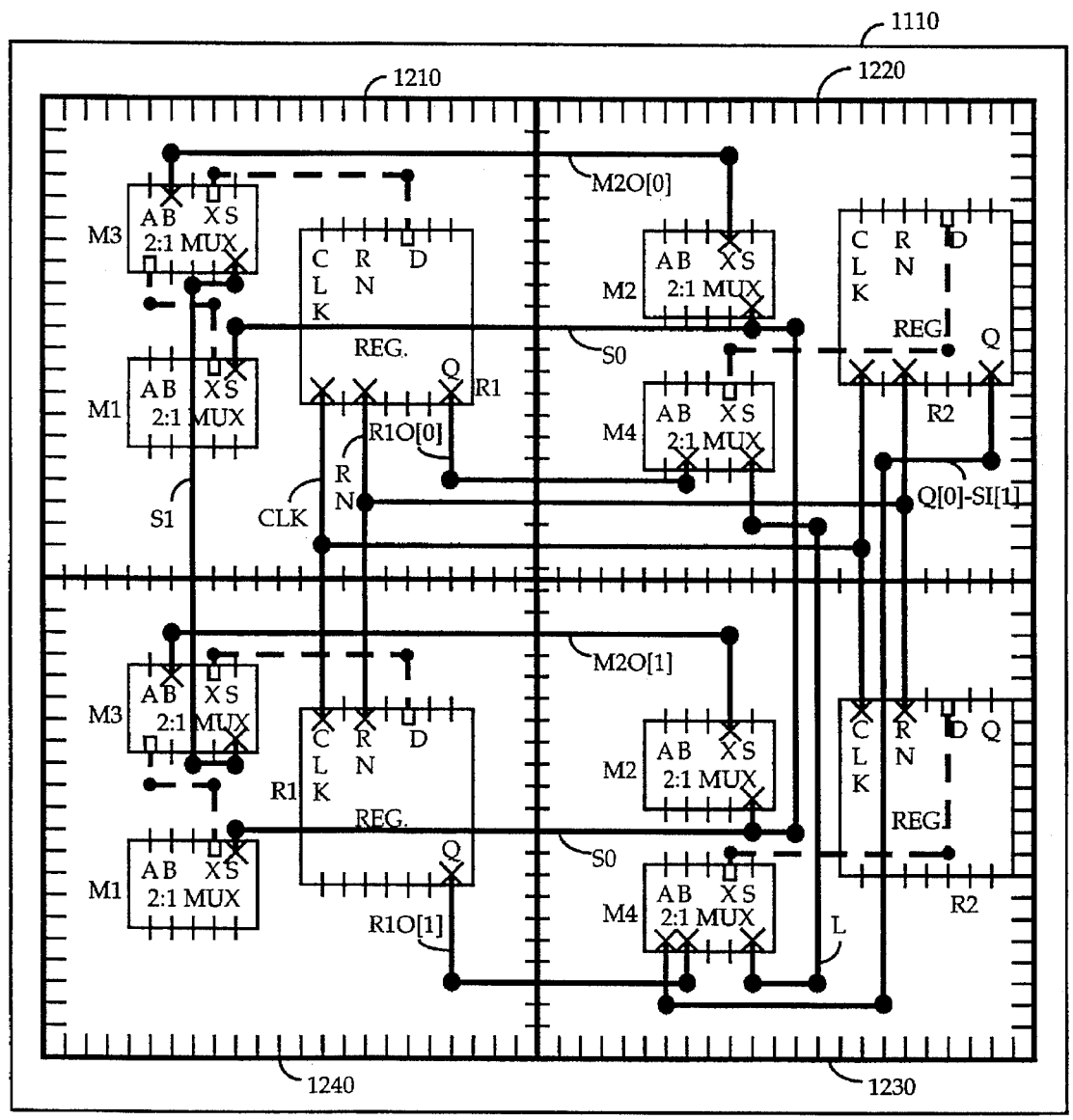
FIG. 14 shows a Bin which contains Bits 0–1.

FIG. 14 shows Bin 1110 which contains Bits 0–1. Bin 1110 has four sub-bins 1210-1240. The dotted line connections were those already shown in FIG. 13. The solid lines show connections that are intra-bin 1110 and cross-the-boundaries for sub-bins 1210-1240. These intra-bin connections follow the "global routing" patterns shown in FIG. 12. Thus, in the top down stage of the process, certain optimization and capacity constraints are met during the divide by four partition step. Meanwhile, a global routing pattern for each cross-boundary signal is established. During the bottom up physical implementation stage, the detailed routing patterns follows those established in the partition stage.

Figure 15:
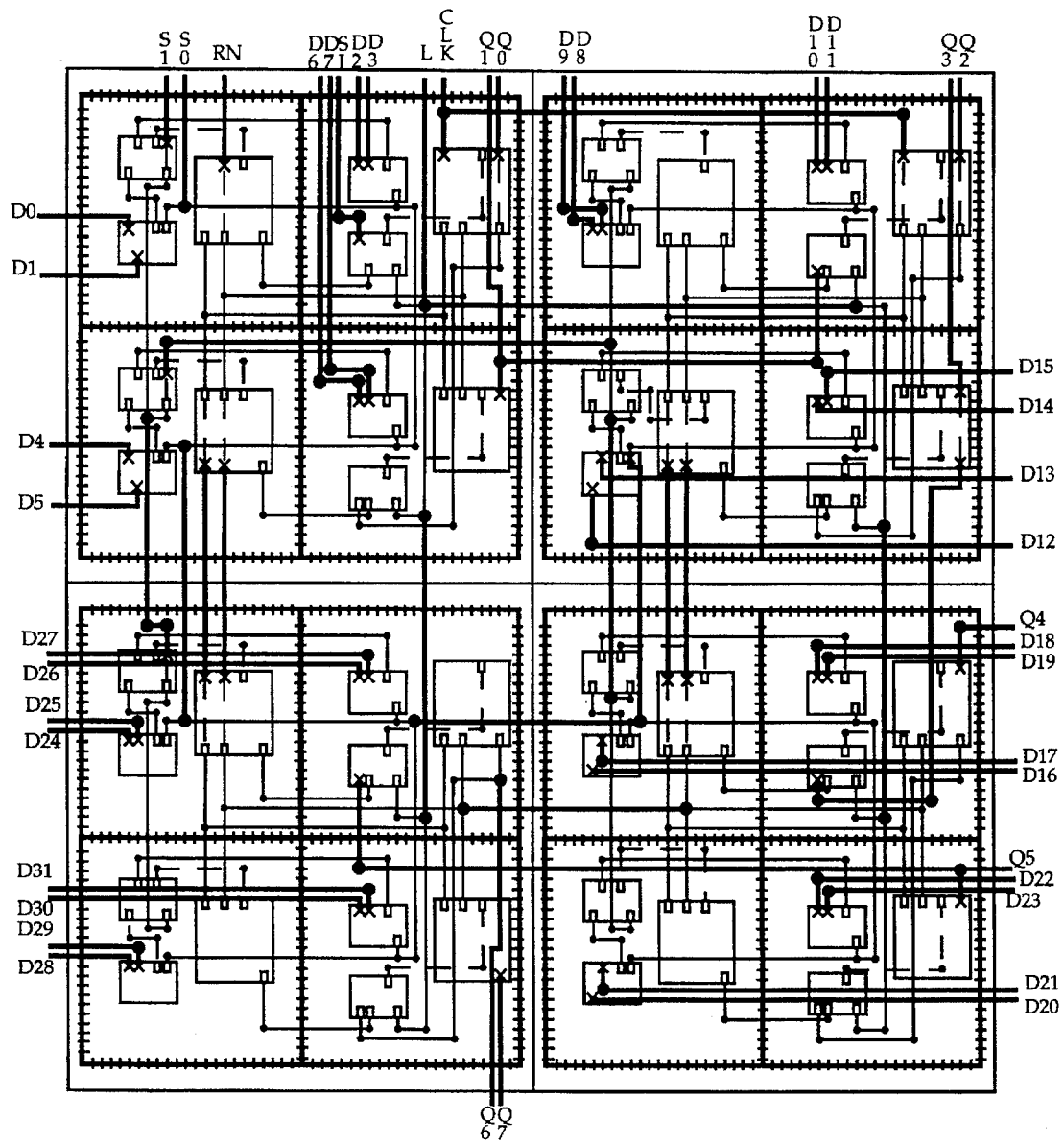
FIG. 15 shows the complete routing implementation of 8 bits across four blocks.

The above process is repeated until the topmost partition level is reached. FIG. 15 shows the complete routing implementation of 8 bits across four blocks. The darker lines terminating with "X" as pins, show the top level intra-bin connections (where the total system is one bin). This corresponds to the global routing patterns shown in FIG. 11B. In addition, each input and output pins of the system is brought out to the peripheral of the system as shown in FIG. 15. The lighter lines are connections of the next lower level partitions which corresponds to the solid lines in FIG. 14. The dotted light lines correspond to the lowest level of partitions of those in FIG. 13.

There is a major difference between FPGA and MGA during the top down partition and bottom up implementation process. The routing resources for FPGA are mostly fixed at each level of the partition process. In contrast, for MGA applications, the total resources are fixed but can be flexible at each level of partition by trading off resources from one level to the other. For fixed capacity cases (e.g., FPGA, Masked Gate Arrays, etc.), wherein the number of component placement sites and amount of routing resources are fixed, failure in any step to place and route the components within any bin at any level means that the implementation of the system can not be completed using the above method. There are two alternatives when such a failure occurs. One approach is to transfer the design to a larger resources part and repeat the process until it is successful. The other approach is to adapt an iterative procedure whereby the Top-Down Process is revisited with a more refined capacity estimation. An iterative analysis on alternative boundary-crossing estimates is then performed.

For variable capacity cases (e.g. standard cells IC, microprocessors, multiple layers PC Board, etc.) whereby both the components sites and the routing resources are flexible, the above described method can be applied. Applying an iterative process can reduce the resources required and make the final implementation more efficient in terms of die size. This is not as critical for fixed capacity cases.

In summary, each bin spawns four sub-bins at each level of the partition process. At the topmost level, the total system capacity constraints is determined. If the capacity is not adequate, then a larger device, system, etc. must be used before continuing with the partition process. The typical constraints include the number of I/O signal sites, the routing resources necessary to route those signals, the number of components that can be fitted, etc. Once the topmost level capacity check is completed, the system is then divided into four bins, each of which will have its own capacity constraints. Next, the components are assigned. Both boundary crossing optimization and capacity constraints checking are performed. The Bin Assignment Optimization phase for the partition process is dependent on both the architecture and the constraints imposed by the particular problem posed (e.g. fixed resources such as FPGA, partially flexible case such as MGA, flexible resources such as PCB). For example, in the FPGA case, both the amount of logic that can be fitted into each bin and the number of access points available within each bin must be considered, in addition to the inter-bin boundary crossing capacity. In the FPGA case, the components assignments are based on routing resources limitations as measured by boundary-crossing, the amount of logic that can be accommodated in the bin as well as the number of access points to insure high degree of routing. For the MGA case, the components assignments are based on routing resources limitations as measured by boundary-crossing. The resources can have trade-offs among different levels of partition, the amount of logic that can be accommodated in the bin, and the number of signals that can be routed within the bin. Once the current level of partition is completed, then next level starts by dividing each of the higher level bins into four bins. This process is reiterated for each level.

FIG. 16 shows the flow chart describing the steps for the top down partition process associated with the divide-by-four method. Initially, a determination is made as to whether all the components of the system will fit within the system capacity constraints (B≦C,B=B(0,1) where B=all components in the system, B(i,j)=Level i, $j^{th}$ Bin, and C=system capacity constraints), step 1601. If there is no fit, the process stops and exits, step 1610. According to steps 1602 and 1609, for each of the partition levels i=1 to L (i being the level and L being the number of partition levels), steps 1603-1608 are performed. And according to steps 1603 and 1608, for each of the bins at partition level i,j=1 to $4^{i-1}$, steps 1604-1607 are performed. In step 1604, n is set to size (B(i-1,j)). The bin B(i-1,j) is then subdivided into four sub-bins as b(i, j, k), where k=1 to 4. It should be noted that the present invention is not limited to this divide-by-two-by-two process. Other factors, such as a 2×2×2 (e.g., divide by eight) for three dimensional applications can be applied to the present invention. For example, a divide-by-eight partitioning process can be utilized (e.g., for piping facility layout for a building). In step 1606, the components are optimized to bin assignment. Next, B(i, (j−1)*4+K)=(b(i, j, k), k=1 to 4), step 1607.

FIG. 17 is a flowchart describing the steps for optimizing bin assignments. According to steps 1701 and 1705 for each component c in Bin (i, j) for I=1 to n, steps 1702-1704 are performed. And according to steps 1702 and 1704, step 1703 is repeated for b(i, j, k); where k=1 to 4. In step 1703, the component c is assigned to the Bin having the minimum boundary crossings—subject to the capacity constraints C((i, j, k), m) for each Bin b(i, j, k); where m=1 to M. For FPGA applications, C((i, j, k), m)=the number of I-Matrix lines in a cluster, the number of block connectors in a block, or the number components that fits, etc. For Masked Gate Array applications, C((i, j, k), m)=the number of via sites for macro I/Os within bin B(i, j, k,) or the numbers of components that fits, etc.

Thus, an apparatus and method for partitioning resources for interconnections is disclosed.

What is claimed is:

1. A method for placement of components of a device into partitions, said device having a defined surface area for placement of the components, said device having multiple mutually distinct levels of interconnect resources, the interconnect resources of each subsequent level of the level of the multiple levels spanning a proportionately shorter distance than the interconnect resources of an immediately prior level, said method comprising the steps of:
   a) establishing a first level of partitions corresponding to a first level of interconnect resources of the multiple levels of interconnect resources by dividing the surface area of the device into a plurality of first partitions, said first level of interconnect resources crossing a boundary between adjacent partitions of the first level of partitions;
   b) optimizing an assignment of each component to one of said plurality of first partitions based upon interconnect resources comprising the first level of interconnect resources;
   c) establishing subsequent levels of partitions until a predefined level is reached, said subsequent levels of partitions corresponding to respective subsequent levels of interconnect resources, each subsequent level of interconnect resources crossing a boundary between adjacent partitions of a corresponding level of partitions, each subsequent level of partitions generated by dividing each immediate prior level partition into a corresponding plurality of subsequent partitions and optimizing the assignment of each component in the prior level partition to one of the corresponding plurality of subsequent partitions based upon the subsequent level of interconnect resources and levels of interconnect resources prior to the subsequent level of interconnect resources.

2. The method as set forth in claim 1, further comprising the steps of determining whether the components exceed the capacity constraints of the device, and performing steps a), b) and c) if the components do not exceed the capacity constraints of the device.

3. The method of claim 2, wherein capacity constraints of said device includes the number of components of said system, number of interconnect resources, number of components that can fit within the surface area, and input/output routing access.

4. The method of claim 1, wherein said step of establishing a first level of partitions divides the surface area into four partitions and said step of establishing subsequent levels of partitions divides each immediate prior level partition into four subsequent partitions.

5. The method of claim 4, wherein the span of each interconnect resource that crosses a partition boundary is proportional to lengths of two of said partitions of a corresponding level.

6. The method of claim 5, wherein said lengths of two of said partitions of said corresponding level is proportional to half a length of two partitions of a subsequent level.

7. The method of claim 6, wherein said lengths of said two of said partitions of said corresponding level is proportional to twice the length of two partitions of an immediate prior level.

8. The method of claim 1, wherein said step of optimizing an assignment of each component to one of said plurality of first partitions is a function of partition capacity, routing resources, and access resources.

9. The method as set forth in claim 1, wherein the predefined level is reached when partition capacity constraints are exceeded, said partition capacity constraints comprising a number of interconnect resources located across boundaries of partitions.

10. The method as set forth in claim 1, wherein the predefined level corresponds to the number of levels of interconnect resources.

11. An apparatus for placement of components of a device into partitions, said device having a defined surface area for placement of the components, said device having multiple mutually distinct levels of interconnect resources, the interconnect resources of each subsequent level of the level of the multiple levels spanning a proportionately shorter distance than the interconnect resources of an immediately prior level, said apparatus comprising:
   a) means for establishing a first level of partitions corresponding to a first level of interconnect resources of the multiple levels of interconnect resources by dividing the surface area of the device into a plurality of first partitions, said first level of interconnect resources crossing a boundary between adjacent partitions of the first level of partitions;
   b) means for optimizing an assignment of each component to one of said plurality of first partitions based upon interconnect resources comprising the first level of interconnect resources;
   c) means for establishing subsequent levels of partitions until a predefined level is reached, said subsequent levels of partitions corresponding to respective subsequent levels of interconnect resources, each subsequent level of interconnect resources crossing a boundary between adjacent partitions of a corresponding level of partitions, each subsequent level of partitions generated by dividing each immediate prior level partition into a corresponding plurality of subsequent partitions and optimizing the assignment of each component in the prior level partition to one of the corresponding plurality of subsequent partitions based upon the subsequent level of interconnect resources and levels of interconnect resources prior to the subsequent level of interconnect resources.

12. The apparatus as set forth in claim 11, wherein the means for establishing a first level of partitions, means for optimizing and means for establishing subsequent levels of partitions comprises a computer system.

13. The apparatus as set forth in claim 11, wherein the means for establishing a first level of partitions divides the surface area into four partitions and the means for establishing subsequent levels of partitions divides each immediate prior level partition into four subsequent partitions.

14. The apparatus of claim 13, wherein a span of each interconnect resource that crosses a partition boundary is proportional to lengths of two of said partitions of a corresponding level.

15. The apparatus of claim 14, wherein said lengths of two of said partitions of said corresponding level is proportional to half the length of two partitions of a subsequent level.

16. The apparatus of claim 15, wherein said lengths of said two of said partitions of said corresponding level is proportional to twice the length of two partitions of an immediate prior level.

17. The apparatus as set forth in claim 11, further comprising a means for determining whether the components exceed the capacity constraints of the device, and controlling such that the means for establishing a first level of partitions, means for optimizing and means for establishing subsequent levels of partitions do not execute if the components do not exceed the capacity constraints of the device.

18. The apparatus as set forth in claim 11, wherein the predefined level corresponds to the number of levels of interconnect resources.

19. The apparatus as set forth in claim 11, wherein said means for optimizing an assignment of each component to a plurality of first partitions and means for establishing subsequent levels of partitions optimize as a function of partition capacity, routing resources, and access resources.

20. A method for partitioning a surface area of a programmable logic device into four partitions corresponding to a level of routing resources of said programmable logic device, said method comprising the steps of:

dividing said surface area in two in a first axis;

dividing said surface area in two in a second axis, wherein said second axis intersects said first axis perpendicularly and said surface area is divided into said four partitions;

determining said routing resources that are required to implement a circuit design based on a routing pattern of the routing resources, said step of determining said routing resources determining extra routing resources needed to route connections between a first component located within a first partition of the four partitions to a second component located within a second partition of the four partitions, wherein the first and second partitions are diagonally opposed partitions and the routing resources needed to provide L-shaped connections are included;

optimizing said routing resources in relation to a component capacity of said programmable logic device.

21. The method of claim 20, further comprising the steps of determining a number of components of said programmable logic device, a number of routing resources that span across boundaries of said four partitions, and input/output routing accesses; wherein said steps of dividing said surface area in two in a first axis, dividing said surface area in two in a second axis, determining and optimizing are not performed if the number of components, the number of routing resources that span boundaries and input/output routing accesses exceeds a device capacity.

22. The method of claim 21 wherein a span of one of said L shaped connections that crosses two boundaries is proportional to a length of four of said partitions.

23. The method of claim 21, wherein a span of a routing resource that crosses one of said boundaries is proportional to lengths of two of said four partitions.

* * * * *

UNITED STATES PATENT AND TRADEMARK OFFICE
CERTIFICATE OF CORRECTION

PATENT NO. : 5,640,327
DATED : June 17, 1997
INVENTOR(S) : Benjamin S. Ting

It is certified that error appears in the above-indentified patent and that said Letters Patent is hereby corrected as shown below:

In column 2 at line 37 delete "dusters" and insert --clusters--

In column 8 at line 55 delete "duster" and insert --cluster--

In column 8 at line 64 delete "dusters" and insert --clusters--

In column 9 at line 23 delete "signals. Q0-Q7" and insert --signals Q0-Q7"

In column 13 at line 8 delete "numbers" and insert --number--

Signed and Sealed this

Twenty-third Day of November, 1999

Attest:

Q. TODD DICKINSON

Attesting Officer     Acting Commissioner of Patents and Trademarks